(12) United States Patent
Dupont De Dinechin

(10) Patent No.: US 11,995,526 B2
(45) Date of Patent: May 28, 2024

(54) MODELLING OPERATIONS ON FUNCTIONAL STRUCTURES

(71) Applicant: DASSAULT SYSTEMES, Velizy-Villacoublay (FR)

(72) Inventor: Louis Dupont De Dinechin, Velizy-Villacoublay (FR)

(73) Assignee: DASSAULT SYSTEMES, Velizy-Villacoublay (FR)

( * ) Notice: Subject to any disclaimer, the term of this patent is extended or adjusted under 35 U.S.C. 154(b) by 0 days.

(21) Appl. No.: 18/147,671

(22) Filed: Dec. 28, 2022

(65) Prior Publication Data

US 2023/0162093 A1    May 25, 2023

Related U.S. Application Data

(63) Continuation of application No. 16/922,911, filed on Jul. 7, 2020, now Pat. No. 11,636,395.

(30) Foreign Application Priority Data

Jul. 7, 2019  (EP) ..................................... 19305925

(51) Int. Cl.
*G06F 30/27*    (2020.01)
*G06F 16/22*    (2019.01)
(Continued)

(52) U.S. Cl.
CPC ............. *G06N 20/00* (2019.01); *G06F 16/22* (2019.01); *G06F 30/10* (2020.01); *G06F 30/27* (2020.01)

(58) Field of Classification Search
CPC ......... G06N 20/00; G06F 16/22; G06F 30/10; G06F 30/27
See application file for complete search history.

(56) References Cited

U.S. PATENT DOCUMENTS 11,556,678 B2 *   1/2023  Mehr ...................... G06T 9/001
2014/0330889 A1 * 11/2014  Brasche ............. H04L 67/1095
                                                   709/203
(Continued)

OTHER PUBLICATIONS

Y. Wang, et al.; "Symmetry Hierarchy of Man-Made Objects"; Eurographics 2010/M.Chen and O.Deussen (Guest Editors); vol. 30 (2011), No. 2; 10 pgs.

(Continued)

*Primary Examiner* — Beau D Spratt
(74) *Attorney, Agent, or Firm* — Oblon, McClelland, Maier & Neustadt, L.L.P.

(57) ABSTRACT

The disclosure notably relates to a computer-implemented method for teaching a generative autoencoder. The generative autoencoder is configured to generate functional structures. A functional structure is a data structure representing a mechanical assembly of rigid parts and which includes a tree. Each leaf node represents a shape and positioning of a respective rigid part and a force exerted on the respective rigid part. Each non-leaf node with several children represents a mechanical link between sub-assemblies. Each sub-assembly is represented by a respective one of the several children. Each non-leaf node with a single child represents a duplication of the sub-assembly represented by the single child. The method includes obtaining a dataset including functional structures. The method further comprises teaching the generative autoencoder on the dataset. This constitutes an improved method for teaching a generative autoencoder configured for generating functional structures.

15 Claims, 11 Drawing Sheets

(51) Int. Cl.
*G06N 20/00* (2019.01)
*G06F 30/10* (2020.01)

(56) References Cited

U.S. PATENT DOCUMENTS

| | | | |
|---|---|---|---|
| 2018/0089532 A1* | 3/2018 | Xu | G06V 10/56 |
| 2019/0073520 A1 | 3/2019 | Ayyar | |
| 2019/0135300 A1 | 5/2019 | Gonzalez Aguirre | |
| 2019/0347381 A1 | 11/2019 | Benjamin | |
| 2020/0285885 A1 | 9/2020 | Hoang | |
| 2020/0310370 A1 | 10/2020 | Bogo | |
| 2020/0342634 A1* | 10/2020 | Barnes | G06T 11/001 |
| 2020/0363791 A1 | 11/2020 | Sakumiya | |
| 2020/0363815 A1 | 11/2020 | Mousavian | |
| 2020/0382402 A1 | 12/2020 | Kolar | |
| 2021/0256353 A1 | 8/2021 | Nilsson | |

OTHER PUBLICATIONS

Jiajun Wu, et al.; "Learning a Probabilistic Latent Space of Object Shapes via 3D Generative-Adversarial Modeling"; 29$^{th}$ Conference on Neural Information Processing Systems (NIPS 2016), Barcelona, Spain; arXiv:1610.07584V2 [cs.CV], Jan. 4, 2017; 11 pgs.

Jun Li, et al.; "GRASS: Generative Recursive Autoencoders for Shape Structures"; ACM Transactions on Graphics, vol. 36, No. 4, Article 52; Publication date; Jul. 2017; 14 pgs.

Niloy J. Mitra, et al.; "Structure-Aware Shape Processing"; EUROGRAPHICS 2013/M Sbert, L. Szirmay-Kalos; Star—State of the Art Report; 23 pgs.

Manyi Li, et al; GRAINS: Generative Recursive Autoencoders for Indoor Scenes; X-ARCHIVE, May 8, 2019; XP055654674; Retrieved from the Internet: URL:https://arxiv.org/pdf/1807.09193.pdf [retrieved on Jan. 2, 2020; 10 pgs.

Mehmet Ersin Yumer, et al.; "Procedural Modeling Using Autoencoder Networks"; Proceedings of the 28$^{th}$ Annual ACM Symposium on User Interface Software & Technology, UIST '15, ACM Press, New York, New York; USA; Nov. 5, 2015; XP058076865;10 pgs.

Extended Search Report dated Feb. 7, 2020 in Europe Patent Application No. 19305925.0-1224; 10 pgs.

* cited by examiner 82    84

122  124  126  128

MODELLING OPERATIONS ON FUNCTIONAL STRUCTURES

CROSS-REFERENCE TO RELATED APPLICATIONS

This application is a continuation of U.S. application Ser. No. 16/922,911, filed Jul. 7, 2020, which is based upon and claims priority under 35 U.S.C. § 119 or 365 to European Application No. 19305925.0, filed Jul. 7, 2019. The entire contents of the above application(s) are incorporated herein by reference.

FIELD

The disclosure relates to the field of computer programs and systems, and more specifically to a method, system and program for learning a generative autoencoder configured for generating functional structures.

BACKGROUND

A number of systems and programs are offered on the market for the design, the engineering and the manufacturing of objects. CAD is an acronym for Computer-Aided Design, e.g., it relates to software solutions for designing an object. CAE is an acronym for Computer-Aided Engineering, e.g., it relates to software solutions for simulating the physical behavior of a future product. CAM is an acronym for Computer-Aided Manufacturing, e.g., it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Within this context and other contexts, machine learning is gaining wide importance.

Existing methods relate to the context of learning tasks on 3D shapes, but they provide unrealistic results in the context of CAD. Indeed, unlike images or videos, a 3D shape does not have a natural parameterization over a regular grid. Existing methods choose to represent 3D shapes with mesh, point clouds, voxels or multi-view representations. These representations of 3D do not take into account a fundamental characteristic of 3D shapes: their hierarchical structure. CAD 3D data inherently contains this aspect through the product structure definition.

Recently, the success of deep neural networks in computer vision, speech recognition, and natural language processing has inspired researchers to apply such models to 3D shape analysis. Most of these works have focused on extending computer vision techniques developed for images—2D grids of pixels—to 3D grids of voxels. Approaches such as the work of J. Wu et al (J. Wu, C. Zhang, T. Xue, W. T. Freeman, J. B. Tenenbaum, *Learning a Probabilistic Latent Space of Object Shapes via 3D Generative-Adversarial Modeling*, 2016) succeed in learning a probabilistic latent space of object shapes in the form of voxels. At its core, their model is a generative decoder that takes as input a shape code and produces a voxel grid as output. The decoder is trained adversarially and may be chained with a prior encoder that maps, say, a 2D image to the corresponding shape code. The method supports simple arithmetic and interpolation on the codes, enabling, for instance, topology-varying morphs between different shapes. However, these approaches are not able to handle hierarchically structured data such as CAD data.

Within this context, there is still a need for an improved method for learning a generative autoencoder configured for generating functional structures.

SUMMARY

It is therefore provided a computer-implemented method for learning a generative autoencoder. The generative autoencoder is configured for generating functional structures. A functional structure is a data structure representing a mechanical assembly of rigid parts. The data structure includes a tree. The tree comprises leaf nodes. Each leaf node represents a shape and positioning of a respective rigid part and a force exerted on the respective rigid part. The tree further comprises non-leaf nodes each with several children. Each non-leaf node with several children represents a mechanical link between sub-assemblies. Each sub-assembly is represented by a respective one of the several children. The tree further includes non-leaf nodes with a single child. Each non-leaf node with a single child represents a duplication of the sub-assembly represented by the single child. The method comprises providing a dataset including functional structures. The method further comprises learning the generative autoencoder on the dataset.

The method may comprise one or more of the following:
  the mechanical link is an adjacency relation between the sub-assemblies, the adjacency relation optionally belonging to a predetermined set of adjacency relations;
  the duplication is a symmetry relation between instances of the sub-assembly, the symmetry relation optionally belonging to a predetermined set of symmetry relations;
  the shape and positioning of the respective rigid part is represented by data comprising a specification of a bounding box around the respective rigid part, and the force exerted on the respective rigid part is a resulting force;
  the generative autoencoder comprises:
    an encoder including a leaf encoding module, a mechanical link encoding module, and a duplication encoding module; and
    a decoder including a node classifier, a leaf decoding module, a mechanical link decoding module, and a duplication decoding module;
      the encoder being configured, with respect to a given functional structure, for encoding the tree into a single latent vector according to a recursive bottom-up process where:
        the leaf encoding module outputs, for each leaf node, a respective latent vector, based on the data comprising the specification of the bounding box and the resulting force;

the mechanical link encoding module outputs, for each non-leaf node representing a mechanical link, a respective latent vector, based on the several latent vectors which encode the respective several children of the non-leaf node; and the duplication encoding module outputs, for each non-leaf node representing a duplication, a respective latent vector, based on the latent vector which encodes the respective single child of the non-leaf node;

the decoder being configured, with respect to a given single latent vector, for decoding the given single latent vector into a tree of a functional structure according to a recursive top-down process where:

the node classifier classifies each latent vector produced during the decoding, as corresponding to a leaf node, to a non-leaf node representing a mechanical link, or to a non-leaf node representing a duplication;

the leaf decoding module outputs, for each latent vector classified as corresponding to a leaf node during the decoding, data comprising a specification of a respective bounding box and a respective resulting force, based on the latent vector;

the mechanical link decoding module outputs, for each latent vector classified as corresponding to a non-leaf node representing a mechanical link during the decoding, several child latent vectors, based on the latent vector; and the duplication decoding module outputs, for each latent vector classified as corresponding to a non-leaf node representing a duplication during the decoding, a single child latent vector, based on the latent vector;

one or more nodes of the tree of at least a part of the functional structures of the dataset are each tagged with one label among a predetermined list of labels, and the method further comprises learning a latent space classifier, the latent space classifier being configured to take as input a latent vector and to tag the latent vector with one label of the predetermined list of labels; and/or the bounding box and the resulting force are respectively represented by first coordinates and second coordinates of a same vector.

It is further proposed a generative autoencoder learnable according to the method. The generative autoencoder has an encoder and a decoder.

It is further proposed a computer-implemented method of use of the generative autoencoder. The method of use comprises providing one or more latent vectors. The method of use further comprises generating a functional structure. The generating comprises decoding each latent vector with the decoder.

The method of use may comprise one or more of the following:

performing a topology optimization on the mechanical assembly of rigid parts represented by the generated functional structure;

the generating generates forces which are each a force represented by a leaf node of the tree included in the generated functional structure, and wherein the generated forces form inputs of the topology optimization; and/or the autoencoder being learnable according to claim 6:

the one or more latent vectors comprise a first latent vector and a second latent vector;

the decoding produces, for each of the first latent vector and the second latent vector, respective latent vectors including respective intermediate latent vectors;

the generating of the functional structure comprises performing an interpolation operation between a first intermediate latent vector of the first latent vector and a second intermediate latent vector of the second latent vector, based on a same label tagging the first intermediate latent vector and the second intermediate latent vector.

It is further provided a computer program comprising instructions for performing the method and/or the method of use.

It is further provided a device comprising a data storage medium having recorded thereon the generative autoencoder and/or the computer program.

The device may form or serve as a non-transitory computer-readable medium, for example on a SaaS (Software as a service) or other server, or a cloud based platform, or the like. The device may alternatively comprise a processor coupled to the data storage medium. The device may thus form a computer system in whole or in part (e.g., the device is a subsystem of the overall system). The system may further comprise a graphical user interface coupled to the processor.

BRIEF DESCRIPTION OF THE DRAWINGS

Embodiments will now be described, by way of non-limiting example, and in reference to the accompanying drawings, where.

DETAILED DESCRIPTION

Figure 1:
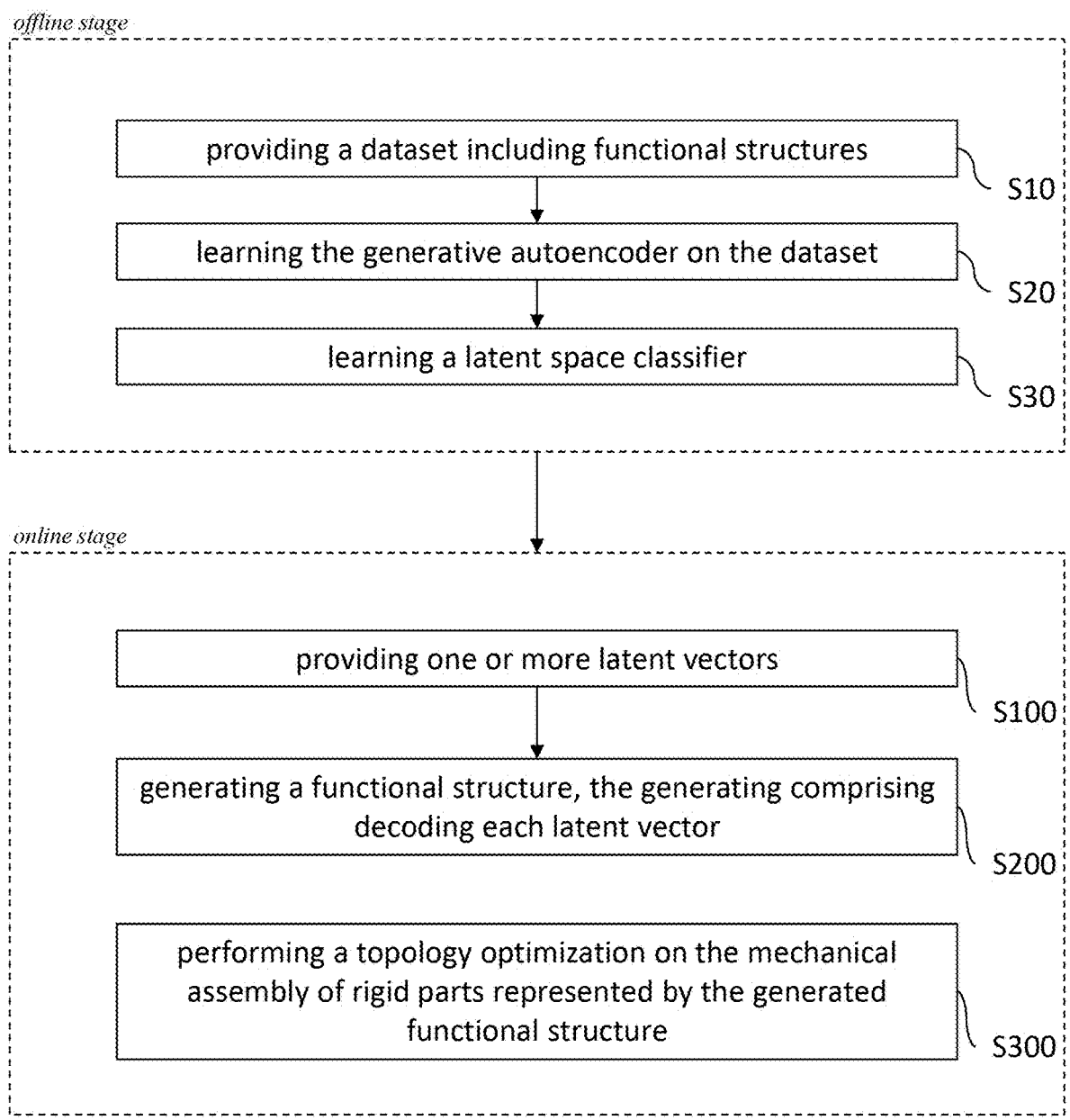
FIG. 1 shows a flowchart of a process integrating the method and the method of use.

It is proposed a computer-implemented method for learning a generative autoencoder. The generative autoencoder is configured for generating functional structures. A functional structure is a data structure representing a mechanical assembly of rigid parts. The data structure includes a tree. The tree comprises leaf nodes. Each leaf node represents a shape and positioning of a respective rigid part and a force exerted on the respective rigid part. The tree further comprises non-leaf nodes each with several children. Each non-leaf node with several children represents a mechanical link between sub-assemblies. Each sub-assembly is represented by a respective one of the several children. The tree further includes non-leaf nodes with a single child. Each non-leaf node with a single child represents a duplication of the sub-assembly represented by the single child. The method comprises providing a dataset including functional structures. The method further comprises learning the generative autoencoder on the dataset. Such a method may be referred to as "the learning method".

This constitutes an improved method for learning a generative autoencoder configured for generating functional structures.

Notably, the generative autoencoder learnt according to the learning method is configured to generate on the fly (because it is generative) functional structures each representing a respective mechanical assembly of rigid parts, because the generative autoencoder is learnt on a dataset including such functional structures. The generative autoencoder generates accurately these functional structures (i.e., the level of realism of the generated functional structures is as close as possible as that of the functional structure of the dataset), because it is learnt to do so. Such a functional structure is a hierarchical data structure, since it includes a tree comprising: leaf nodes each representing a shape and positioning of a respective rigid part and a force exerted on the respective rigid part, non-leaf nodes each with several children and each representing a mechanical link between sub-assemblies (each sub-assembly being represented by a respective one of the several children) and non-leaf nodes with a single child and each representing a duplication of the sub-assembly represented by the single child. In other words the tree captures relations, namely mechanical links (e.g., adjacency relations) and duplications (e.g., symmetry relations), between parts and/or sub-assemblies of parts of a mechanical assembly of parts, and a hierarchical arrangement thereof. In other words the learning method is able to handle hierarchical data structures pertaining to mechanical assemblies of parts and yields and autoencoder able to generate on the fly such data structures. The learning method thus allows to generate physically realistic CAD data, which can be directly exploited in design and/or manufacturing processes, as explained hereinbelow.

Moreover, the functional structures are particularly adapted for being used in (e.g., as) a dataset for the learning of the generative autoencoder, e.g., they allow for a robust learning of the generative autoencoder on the provided dataset including functional structures. In addition, a functional structure is a data structure which is much more compact than a low level 3D model.

Furthermore, each tree included in the dataset on which the generative autoencoder is learnt according to the learning method has leaf nodes representing a shape and positioning of a respective rigid part. This means that functional structures generated by the generative autoencoder includes trees having such leaf nodes. Such generated functional structures are thereby adapted for topology optimization (that is, for performing a topology optimization on them). Indeed, as known per se from the field of topology optimization, topology optimization algorithms/methods/processes to be performed on a mechanical assembly of parts (or on a data structure or a 3D modeled object representing it) notably take as input physical forces, such as loads, exerted on the parts of the assembly. The learning method yields an autoencoder able to generate a data structure which includes data representing such forces, namely the leaf nodes. Thus, the learning method yields an autoencoder able to generate on the fly data structures representing mechanical assemblies of parts and adapted for topology optimization.

In examples of the learning method, which will be further discussed hereinafter, the generative autoencoder comprises an encoder configured, with respect to a given functional structure, for encoding the tree into a single latent vector according to a recursive bottom-up process. In these examples, the generative autoencoder comprises a decoder configured, with respect to a given single latent vector, for decoding the given single latent vector into a tree of a functional structure according to a recursive top-down process. In these examples, one or more nodes of the tree of at least a part of the functional structures of the dataset (e.g., all of them) may be each tagged with one label among a predetermined list of labels, and the learning method may further comprise learning a latent space classifier. The latent space classifier is a neural network configured to take as input a latent vector and to tag the latent vector with one label of the predetermined list of labels.

In other words, through the recursive top-down decoding process which generates a tree included in a functional structure by decoding a given single latent vector into the tree, intermediate latent vectors are produced. An intermediate latent vector is a latent vector encoding a node of the three, which may be the root node, a leaf node or a non-leaf node with is not the root node either. Each one of these nodes may correspond to a meaningful substructure of a mechanical assembly of parts. This means that intermediate latent vectors encoding nodes corresponding to meaningful sub-structures of mechanical assemblies of parts, such as particularly meaningful sub-assemblies of parts, are generated during the decoding process. By learning the latent space classifier on trees of which nodes corresponding to such sub-structures are tagged with labels of the predetermined list of labels, the learning method yields a latent space classifier able to take as input an intermediate latent vector generated during the decoding process and to tag it with a label of the list. The label may indicate that the intermediate latent vector encodes a node corresponding to a meaningful sub-structure, or to no sub-structure in particular (for instance there may be a label corresponding to an absence of labels). In the first case, the latent space classifier is in other words able to identify and tag intermediate meaningful sub-structures during the decoding process. This allows performing of operations on and/or between substructures, such as an interpolation operation, or a blending operation which is a limit case of interpolation (this will be further discussed hereinbelow). As such, more and/or more various functional structures may be generated by the generative autoencoder.

It is further proposed a generative autoencoder learnable according to the learning method. The generative autoencoder has an encoder and a decoder.

It is further proposed a computer-implemented method of use of the generative autoencoder. The method of use comprises providing one or more latent vectors. The method of use further comprises generating a functional structure. The generating comprises decoding each latent vector with the decoder. The method of use may be referred to as "the generating method".

The generating method thus generates one or more functional structure. The generating method may generate more than one functional structure. For example, the generating may comprise fully decoding (i.e., until the recursive top-down decoding is done) each latent vector each into a respective functional structure. The generating method thus generates on the fly hierarchical data structures each representing, in a physically realistic manner, a respective mechanical assembly of parts.

Alternatively or additionally, the one or more latent vectors may comprise a first latent vector and a second latent vector. In such a case the decoding produces, for each of the first latent vector and the second latent vector, respective latent vectors including respective intermediate latent vectors. Then, the generating of the functional structure may comprises performing an interpolation operation between a first intermediate latent vector of the first latent vector and a second intermediate latent vector of the second latent vector, based on a same label tagging the first intermediate latent vector and the second intermediate latent vector. Said same label may notably be obtained by applying the latent space classifier to both the first intermediate latent vector and the second intermediate latent vector. In any case performing such interpolation operations (or blending operations, which are as previously discussed a limit case of interpolation) generates more and/or more various functional structures by merging/mixing meaningful sub-structures of generated data structures.

The generating method may further comprise performing a topology optimization on the mechanical assembly of rigid parts represented by the generated functional structure. This is made possible because, as previously discussed, the tree of generated functional structure has leaf nodes each representing a shape and positioning of a respective rigid part and a force exerted on the respective rigid part. The topology optimization may notably take as input these forces (or at least a part of them) represented in the generated functional structure. The topology optimization may be performed on every mechanical assembly of rigid parts represented by every functional structure generated according to the generating method or on at least a part of them. Thus, the generating method may yield as many as topologically optimized mechanical assemblies of parts as there are generated functional structures.

The learning method and the generating method may be performed independently, e.g., by different users and/or on different computers. Alternatively, they may be included in a same computer-implemented modeling process. Such a modeling process is now briefly discussed with reference to FIG. 1, which shows a flowchart of the modeling process.

The modeling process comprises an offline stage. The offline stage comprises the learning method. As such, the offline stage notably comprises the providing S10 of the dataset including functional structures according to the learning method and the learning S20 of the generative autoencoder on the dataset according to the learning method. The offline stage may further comprise the learning S30 of the latent space classifier according to the learning method. The modeling process may further comprise storing the learnt generative autoencoder, and where appropriate, the learnt latent space classifier, on a memory.

The process further comprises an online stage. The online stage comprises the generating method of the generative autoencoder learnt according to the learning method at the offline stage. The online stage may notably comprise retrieving (e.g., from a distant computer) the generative autoencoder, and where appropriate the latent space classifier, learnt at the offline stage and stored in a memory as previously discussed. In any case, the online stage comprises the providing S100 of the one or more latent vectors according to the generating method and the generating S200 of the functional structure according to the generating method. The online stage may further comprise the performing S300 of the topology optimization on the mechanical assembly of rigid parts represented by the generated functional structure, according to the generating method.

It is to be noted that the offline stage and the online stage may be performed independently, e.g., by different users, at different times/stages, and/or on different computers.

The learning method, the generating method and/or the modeling process may be included in a design process for designing a mechanical assembly of rigid parts. Designing a mechanical assembly of parts designates any action or series of actions which is at least part of elaborating a 3D modeled object representing the mechanical assembly of parts. The design process may notably comprise generating a functional structure representing the mechanical assembly of parts by using the generative autoencoder learnt by the learning method and/or the offline stage of modeling process. The generating may be that of the generating method and/or of the online stage of the modeling process. In any case the generated data structure may be such that a 3D modeled object representing the mechanical assembly of rigid parts is directly inferable from the generated data structure, and the design process may comprise inferring and optionally displaying the 3D modeled object.

The design process may be a design process for designing via topology optimization the mechanical assembly of rigid parts or a 3D modeled object representing it. In such a case the design process may notably comprise the performing S300 of the topology optimization according to the generating method and/or the online stage of the modeling process. As known per se topology optimization is a computer-implemented technique bridging the fields of product design and physical simulation. It is applied for designing a modeled object representing a mechanical part (e.g., a mechanical assembly of rigid parts) formed in a material, subject in use to loads and having one or more constrained boundaries. This technique focuses on automatically generating optimized generative designs based on modifying their physical properties and behavior typically simulated through Finite Element Analysis (FEA). More specifically, topology optimization works by providing a Finite Element Mesh (FEM) for example by discretizing a design space in small elements, and data associated to the mesh. The technique then finds the optimal distribution and layout of material in the given discrete space by iteratively finding the most efficient elements with respect to a given objective function (e.g., related to the stiffness of the design) and a set of constraints (e.g., related to the total amount of allowable material).

The design process may further be included in a manufacturing process, which may comprise, after performing the design process, producing a physical product corresponding to the 3D modeled object designed/yielded by the design process. In any case, the 3D modeled object designed by the design process may represent a manufacturing object. The modeled object may thus be a modeled solid (i.e., a modeled object that represents a solid).

The learning method, the generating method, and the modeling process are computer-implemented. The concept of computer-implemented method (resp. process) is now discussed.

By "a method (resp. process) is computer-implemented", it is meant that steps (or substantially all the steps) of the method (resp. process) are executed by at least one computer, or any system alike. Thus, steps of the method (resp. process) are performed by the computer, possibly fully automatically, or, semi-automatically. In examples, the triggering of at least some of the steps of the method (resp. process) may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method (resp. process) is to perform the method (resp. process) with a system adapted for this purpose. The system may comprise a processor coupled to a memory and a graphical user interface (GUI), the memory having recorded thereon a computer program comprising instructions for performing the method (resp. process). The memory may also store a database. The memory is any hardware adapted for such storage, possibly comprising several physical distinct parts (e.g., one for the program, and possibly one for the database).

Figure 2:
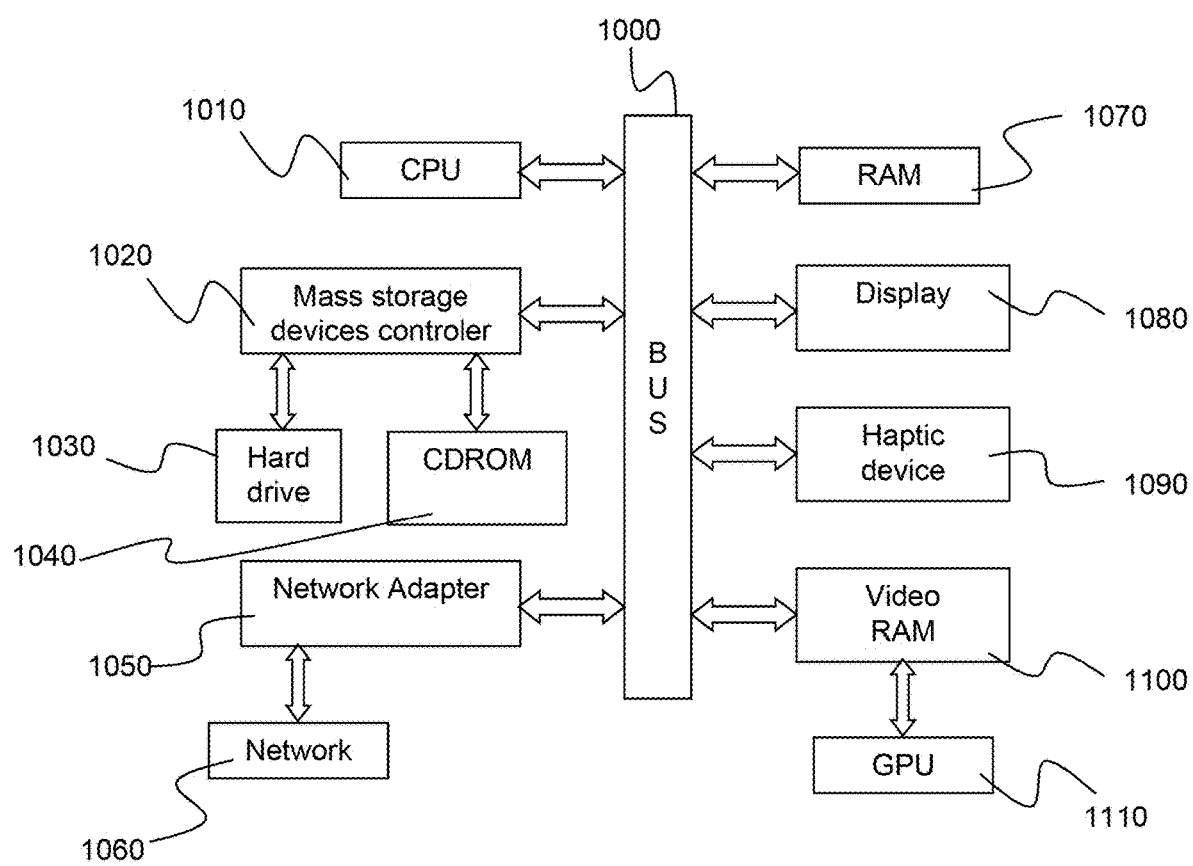
FIG. 2 shows an example of the system.

FIG. 2 shows an example of the system, wherein the system is a client computer system, e.g., a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the learning method, generating method and/or the modelling process. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Process/method steps may be performed by a programmable processor executing a program of instructions to perform functions of the process by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the learning method, generating method and/or the modelling process.

The mechanical assemblies of rigid parts represented by functional structures contemplated by the method, the generating method and/or the modelling process may further be represented by modeled objects, e.g., inferred from the functional structures as previously discussed. A modeled object is any object defined by data stored e.g., in the database. By extension, the expression "modeled object" designates the data itself. According to the type of the system, the modeled objects may be defined by different kinds of data. The system may be a CAD system. In such a system, modeled objects are defined by corresponding data. One may accordingly speak of a CAD object.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g., non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g., representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e., increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g., mechanical) part or assembly of parts (or equivalently an assembly of parts, as the assembly of parts may be seen as a part itself from the point of view of the present disclosure), or more generally any rigid body assembly (e.g., a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object designed according to the present disclosure may thus represent an industrial product which may be any mechanical part, such as a part of a terrestrial vehicle (including e.g., car and light truck equipment, racing cars, motorcycles, truck and motor equipment, trucks and buses, trains), a part of an aerial vehicle (including e.g., airframe equipment, aerospace equipment, propulsion equipment, defense products, airline equipment, space equipment), a part of a naval vehicle (including e.g., navy equipment, commercial ships, offshore equipment, yachts and workboats, marine equipment), a general mechanical part (including e.g., industrial manufacturing machinery, heavy mobile machinery or equipment, installed equipment, industrial equipment product, fabricated metal product, tire manufacturing product), an electro-mechanical or electronic part (including e.g., consumer electronics, security and/or control and/or instrumentation products, computing and communication equipment, semiconductors, medical devices and equipment), a consumer good (including e.g., furniture, home and garden products, leisure goods, fashion products, hard goods retailers' products, soft goods retailers' products), a packaging (including e.g., food and beverage and tobacco, beauty and personal care, household product packaging).

The concept of mechanical assembly of rigid parts is now discussed.

A mechanical assembly of rigid parts designates a set of rigid parts which are linked together into an assembly by a set of relations. A rigid part designates a part of which ability to be deformed is negligible compared to other type of parts, such as deformable parts. Each relation is a relation between two or more rigid parts and represents a relative disposition of the two or more rigid parts in relation to each other, the relative disposition being such that the two or more rigid parts satisfy one or more geometrical constraint (such as a symmetrical positioning of two or more parts) and/or one or more physical constraint (such as a mechanical link linking two or more parts). One relation as such determines a position or a set of possible positions of the two or more rigid parts to which the relation pertains. However, the set of relations incorporates several of such relations in a hierarchical way such that all rigid parts of the set of rigid parts are positioned in relation to each other so as to respect all relations in a certain order, thereby forming a 3D mechanical assembly of rigid parts. The assembly of rigid parts and the way the rigid parts are assembled together are thus captured by an underlying hierarchy of relations organizing rigid parts and/or sub-assemblies of rigid parts in relation to each other. The assembly is referred to as "a mechanical assembly", as the relations between the rigid parts and the hierarchy thereof stems from mechanical constraints (such as structural constraints, functional constraints and/or manufacturing constraints) and/or mechanical requirements (such as structural requirements, functional requirements and/or manufacturing requirements). The assembly of rigid parts comprises sub-assemblies of rigid parts which are themselves assemblies of rigid parts included in the assembly. It is to be understood that a single rigid part may be considered as being a sub-assembly.

A sub-assembly may be what is referred to as "a meaningful substructure". A meaningful substructure designates a sub-assembly of a mechanical assembly of parts which satisfies any one or any combination of the followings:
  the sub-assembly is a functional group, i.e., performing a specific mechanical function;
  the sub-assembly has a specific functionality;
  the sub-assembly comprises specific independent sub-assemblies;
  the sub-assembly obeys to a specific set of manufacturing, structural and/or functional constraints;
  the sub-assembly is manufactured in a specific manufacturing process (e.g., different from other manufacturing processes used for manufacturing other sub-assemblies); and/or
  the sub-assembly is manufactured at a specific step of a manufacturing process (e.g., different from other steps of a manufacturing processes used for manufacturing the mechanical assembly), e.g., the step involving specific mechanical and/or manufacturing considerations.

The generative autoencoder is configured for generating functional structures, and a functional structure is a data structure representing a mechanical assembly of rigid parts. This data structure is now discussed.

The data structure includes (e.g., is) a tree. The tree is a data structure that describes and captures the relations between the rigid parts of the mechanical assembly of rigid parts and the organization and the hierarchy between the relations and the parts. The tree may be any tree, for example a binary tree. As known per se, each non-leaf node of a binary tree has either a single child node or two children nodes. The tree comprises a root node, representing (e.g., corresponding to) the whole mechanical assembly of rigid parts. The tree further comprises leaf nodes, each corresponding to a rigid part of the assembly, and non-leaf nodes (also referred to as internal nodes), each corresponding to a sub-assembly of rigid parts within the assembly. Leaf nodes and non-leaf nodes are now discussed.

The tree comprises leaf nodes each representing a shape and positioning of a respective rigid part and a force exerted on the respective rigid part. In other words, a leaf node corresponds to an atomic part of the mechanical assembly of rigid parts, that is a single rigid part of the assembly. Such a leaf node is now discussed.

By "representing a shape and positioning of a respective rigid part and a force exerted on the respective rigid part", it is meant that the leaf comprises data representing the shape and positioning of the respective rigid part and data representing the force exerted on the respective rigid part.

The data representing the shape and positioning of the respective rigid part may comprise any information describing the shape, the geometry, the type of geometry (such as a type of geometric primitive) and/or the location in space (e.g., relative to other rigid parts and/or to a 3D coordinate system) and/or semantics of the respective rigid part. Said information may be based on a simple representation of the respective rigid part, such as a bounding box and/or a canonical shape.

The data representing the force exerted on the respective rigid part may comprise any information describing a resulting external force exerted on the respective rigid part. The force exerted on the respective rigid part may thus designate the resulting external force exerted on the respective rigid part. The resulting force may be the resultant force of the limit external forces that may be exerted on the respective rigid part before the respective rigid part breaks/and or so that the respective rigid part respects constraints (e.g., manufacturing constraints, structural constraints and/or functional constraints).

In examples, the shape and positioning of the respective rigid part is represented by data comprising a specification of a bounding box around the respective rigid part, such as parameters and/or coordinates characterizing the bounding box. In these examples, the force exerted on the respective rigid part is a resulting force, as previously discussed. The data comprising the specification of the bounding box may further comprise a specification of geometry of the respective rigid part, such as one or more parameter characterizing (e.g., specifying) a type of geometric primitive.

In examples, the bounding box and the resulting force are respectively represented by first coordinates and second coordinates of a same vector. In other words, the leaf node comprises a vector having first coordinates and second coordinates. The first coordinates are parameters characterizing the bounding box around the respective rigid part. The second coordinates are parameters characterizing the resulting force, such as coordinates of the external resultant force vector corresponding to the sum of all external force vectors which apply on (e.g., a point of) the bounding box around the respective rigid part. The vector may optionally comprise one or more third coordinate(s) characterizing (e.g., specifying) a type of geometric primitive corresponding to the shape of the respective rigid part.

The tree further comprises non-leaf nodes each with several children and each representing a mechanical link between sub-assemblies. Each sub-assembly is represented by a respective one of the several children. Such a non-leaf node is now discussed.

Each child of the several children is either a leaf node (i.e., corresponding to a rigid part of the assembly, a rigid part being also a sub-assembly of parts per se) or another non-leaf node (i.e., corresponding to a sub-assembly of rigid parts within the assembly). The mechanical link is a relation linking the parts and sub-assemblies of parts represented respectively by the children. The mechanical link thus characterizes a positioning of said parts and sub-assemblies of parts in relation to each other, as previously discussed. In examples, the mechanical link is described by a vector of mechanical link parameters. In other words, in these examples, the non-leaf node comprises a vector of mechanical link parameters, which is a vector having coordinates that are parameters characterizing the mechanical link. In other words, besides describing a positioning of sub-assemblies or parts in relation to each other, the non-leaf node may comprise a vector of parameters further specifying the mechanical linkage between the sub-assemblies that results in their relative positioning. In alternative examples, the non-leaf node may comprise no such vector of parameters, as in these alternative examples, the mechanical link is entirely characterized by the several children.

In examples, the mechanical link is an adjacency relation between the sub-assemblies, the adjacency relation optionally belonging to a predetermined set of adjacency relations. The predetermined set of adjacency relations may comprise (e.g., be made of) adjacency relations referred to as static adjacency relations and/or adjacency relations referred to as kinematic relations. In other words the mechanical link may be one of a static adjacency relation and a kinematic adjacency relation. A static adjacency relation between two or more sub-assemblies of rigid parts is a relation describing a static contact and/or relative positioning (e.g., through a static mechanical linkage) between the two or more sub-assemblies. A static adjacency relation may be defined as an adjacency relation which has a degree of freedom equal to zero. Sub-assemblies mechanically linked by a static adjacency relation have a fixed relative positioning, i.e., they cannot move relative to one another. A kinematic adjacency relation between two or more sub-assemblies of rigid parts is a relation describing a kinematic contact and/or relative positioning (e.g., through a kinematic mechanical linkage) between the two or more sub-assemblies. A kinematic adjacency relation may be defined as an adjacency relation which has a degree of freedom superior or equal to one. Sub-assemblies mechanically linked by a kinematic adjacency relation have a non-fixed relative positioning, i.e., they can move relative to one another.

The tree further comprises non-leaf nodes with a single child and each representing a duplication of the sub-assembly represented by the single child. Such a non-leaf node is now discussed.

The single child may be a leaf node or another non-leaf node. By "representing a duplication of the sub-assembly represented by the single child", it is meant that the non-leaf node represents several instances of a same rigid part or sub-assembly of rigid parts within the assembly. The non-leaf node may further comprise data specifying a positioning of these several instances in relation to each other and/or the number of these instances.

In examples, the duplication is a symmetry relation between instances of the sub-assembly, the symmetry relation optionally belonging to a predetermined set of symmetry relations. A symmetry relation between instances of the sub-assembly is a relation specifying a symmetrical positioning of the instances in relation to each other. The predetermined set of symmetry relations may include (e.g., be made of) pairwise reflectional symmetries, k-fold rotational symmetries and k-fold translational symmetries. In other words, the symmetry relation may be one of a reflectional symmetry, a k-fold rotational symmetry and a k-fold translational symmetry.

A pairwise reflectional symmetry is a symmetry relation between two instances of a same sub-assembly. It is parametrized by a plane of reflection and specifies that the two instances' positionings are symmetrical with respect to this plane.

A k-fold rotational symmetry is a symmetry relation between a number k (which is an integer larger than 2 or equal to 2) of instances of a same sub-assembly. It is parametrized by the number k and an axis of rotation. It specifies that the instances' positionings are two by two images from one another by a same rotation around the axis of rotation.

A k-fold translational symmetry is a symmetric relation between a number k (which is an integer larger than 2 or equal to 2) of instances of a same sub-assembly. It is parametrized by the number k and a translation offset. It specifies that the instances' positionings are two-by-two images from one another by a same translation characterized by the translation offset.

In examples, the symmetry relation is described by a vector of symmetry relation parameters. In other words, the non-leaf node comprises a vector having coordinates that are symmetry relation parameters. The coordinates may include one or more first coordinate specifying the type of the symmetry relation among a pairwise reflectional symmetry, a k-fold rotational symmetry and a k-fold translational symmetry. The coordinates may include one or more second coordinate specifying the number of instances duplicated by the symmetry relation. The coordinates may include one or more third coordinate specifying geometrical parameters of the symmetry relation, such as the previously discussed plane of reflection, rotation axis or translation offset.

Examples of mechanical assemblies of parts and functional structures thereof are now discussed.

In the context of the present disclosure, a mechanical assembly of parts may be a chair. A chair may often (but not always) comprise four meaningful sub-structures, which are a leg substructure (i.e., the grouping of the legs of the chair), an arm substructure (i.e., the grouping of the arms of the chair), a seat and a back.

Figure 3:
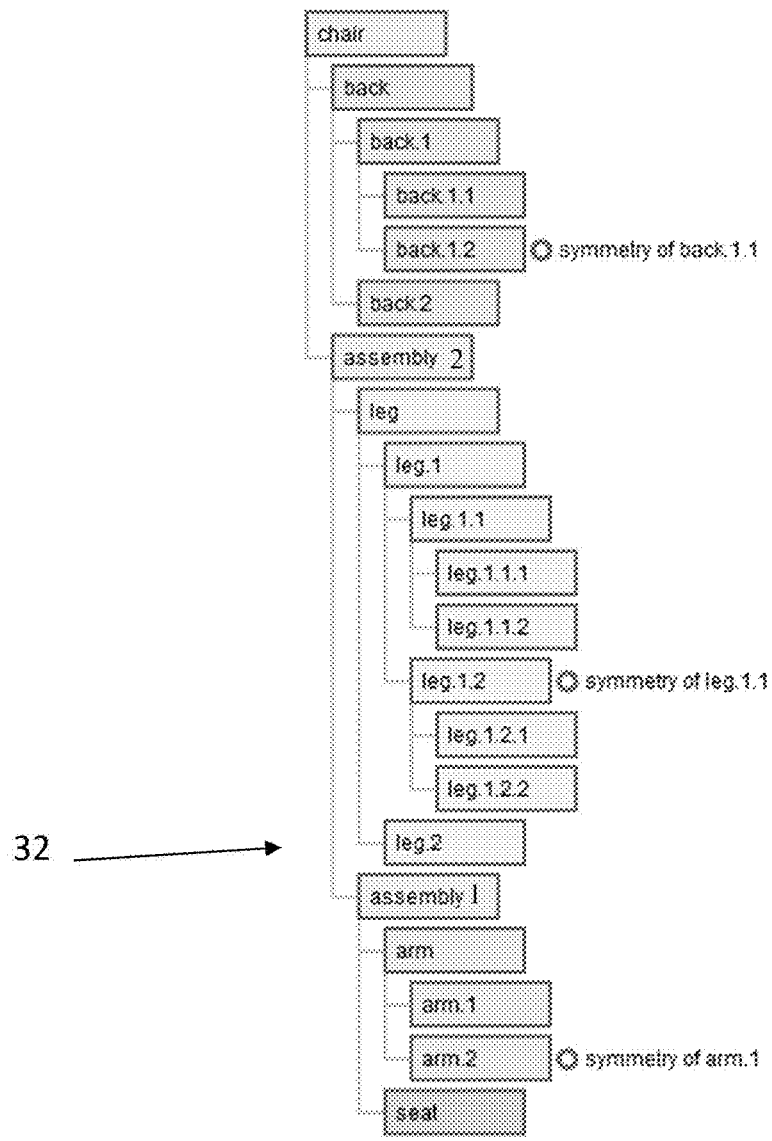
FIGS. 3, 4, 5, 6, 7, 8, 9, 10, 11, 12, 13, 14 and 15 illustrate the methods.
Figure 4:
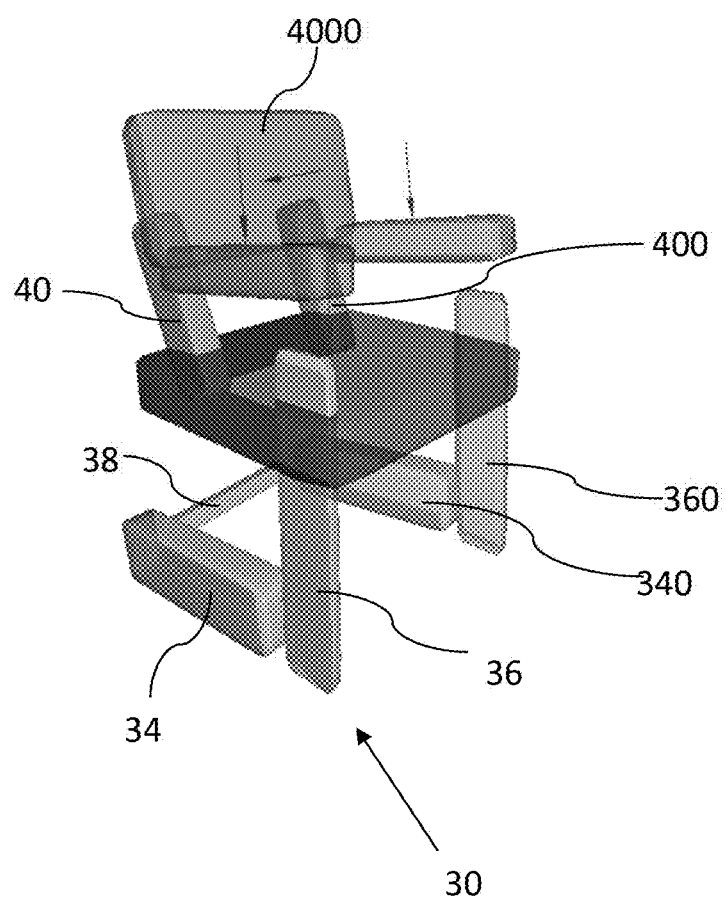

An example of such a chair and of the functional structure thereof is now discussed with reference to FIG. 3 and FIG. 4. FIG. 4 shows a 3D representation 30 of the chair displayed together and FIG. 3 shows the tree 32 of the functional structure representing the chair 30.

The tree 32 comprises a leaf node "arm.1" representing the shape and positioning of a respective one of the two arms of the chair and a force exerted on it. Leaf node "arm.1" is the child of a non-leaf node "arm" representing a duplication of "arm.1". The duplication is a symmetry relation between the arm represented by "arm.1" and the other arm of the chair. A node "arm.2" which represents said other arm of the chair is displayed as another child of "arm" in FIG. 3, only for the sake of convenience. The symmetry relation is a pairwise reflectional symmetry (referring to FIG. 4, the reflection symmetry is a symmetry with respect to a vertical median plane of chair 30 generally orthogonal to chairback 4000, and it may be stored as a vector specifying location of the plane and the symmetry type). Non-leaf node "arm" represents the meaningful sub-structure formed by the arms the chair.

The tree 32 further comprises two leaf nodes "leg.1.1.1" and "leg.1.1.2" which each represents respectively the shape and positioning of a respective one of the two parts 34 and 36 of a leg of the chair and a force exerted on said respective one of the two parts 34 and 36. The tree 32 further comprises the non-leaf node "leg.1.1" which represents an adjacency relation assembling the two parts 34 and 36 represented by the two children nodes "leg.1.1.1" and "leg.1.1.2" of "leg.1.1". "leg.1.1" is the child of "leg.1" representing a duplication of the assembly represented by "leg1.1". The duplication is a symmetry relation between the assembly represented by "leg.1.1" and another instance of it. A node "leg.1.2" which represents said other instance is displayed as another child node of "leg.1", only for the sake of convenience. The symmetry relation is a pairwise reflectional symmetry. "leg.1.2" represents the other one of the two legs of the chair, made of the assembly of the parts 340 and 360. Parts 340 and 360 are respectively represented as leaf nodes "leg.1.2.1" and "leg.1.2.2" in FIG. 3 only for the sake of convenience and are respectively the images of parts 34 and 36 by the pairwise reflectional symmetry. The tree 32 further comprises a leaf node "leg.2" which represents the shape and positioning of the part 38 and a force exerted on it. Leaf node "leg.2" and non-leaf node "leg.1" are the two children of the non-leaf node "leg" which represents an adjacency relation assembling the two symmetric legs of the chairs, represented by node "leg.1", with part 38 represented by node "leg.2". Non-leaf node "leg" represents the meaningful sub-structure formed by the legs of the chair.

The tree 32 further comprises a leaf node "back.1.1" representing the shape and positioning of the part 40 and a force exerted on it. Node "back.1.1" is the child of the non-leaf node "back.1" which represents a duplication of the part 40. The duplication is a symmetry relation between the part 40 and another instance of it, namely the part 400. A node "back.1.2" which represents the part 400 is displayed as another child of "back.1" on FIG. 3, only for the sake of convenience. Leaf-node "back.2" represents the shape and positioning of the part 4000 and a force exerted on it. The tree 32 further comprises a non-leaf node "back" representing an adjacency relation assembling the part 400 with the two instances of part 40, represented by node "back.1". Node "back" represents the meaningful sub-structure formed by the back of the chair.

The tree 32 further comprises a non-leaf node "assembly 1" representing an adjacency relation assembling the seat of the chair, represented by the leaf node "seat", with the arms of the chair, represented by the non-leaf node "arm".

The tree 32 further comprises a non-leaf node "assembly 2" representing an adjacency relation assembling the sub-assembly represented by node "assembly 1" with the legs of the chair, represented by the non-leaf node "leg".

The tree 32 further comprises the root node "chair" which represents the whole chair as well as an adjacency relation assembling the sub-assembly represented by node "assembly 2" with the back of the chair, represented by the non-leaf node "back".

In the context of the present disclosure, a mechanical assembly of rigid parts may be a car. A car may often (but not always) comprise the following meaningful substructures:

Body substructure which may contain one or more of the followings: bonnet, bumper, fender, pillar, rocker, roof, quarter panel, trunk, doors, windows and/or floor;

Interior substructure which may contain: seats and/or dashboard; and

Chassis substructure which may contain one or more of the following: suspensions, wheels, drive shaft, braking system, steering system, and/or engine components.

The tree of the functional structure representing the car may often (but not always) comprise one or more of the following nodes:

Non-leaf nodes each representing a pairwise reflectional symmetry relations between instances of a front door (represented by a leaf node), a back door (represented by a leaf node), a mirror (represented by a leaf node), a headlight (represented by a leaf node) or a seat (represented by a leaf node);

A non-leaf node "a_1" representing an adjacency relation between left front wheel (represented by a leaf node) and left front suspension (represented by a leaf node);

A non-leaf node "s_1" representing a pairwise reflectional symmetry relation between instances of the symmetric assemblies represented by node "a_1", one of these instances being the assembly of made of the right front wheel and of the right front suspension;

A non-leaf node "s_2" representing a pairwise reflectional symmetry relation between instances of the symmetric assemblies represented by node "s_1", one on these instances being the back wheels and suspensions;

A non-leaf node "a_2" representing an adjacency relation between the symmetric assemblies represented by node "s_2" and the drive shaft (represented by a leaf node);

A non-leaf node "s_3" representing a pairwise reflectional symmetry relation between instances of the back seats (represented by a leaf node), one of these instances being the front seats;

A non-leaf node "a_3" representing an adjacency relation between the car floor (represented by a leaf node) and the symmetric assemblies represented by node "s_3"; and/or A non-leaf node "a_4" representing an adjacency relation between the assembly represented by node "a_3" and the car dashboard (represented by a leaf node), the node "a_4" also representing the "interior" substructure of the car.

In the context of the present disclosure, a mechanical assembly of rigid parts may be an articulated robot. An articulated robot may comprise meaningful substructures each corresponding to a specific function of the robot, such as a grasp function, and which may be represented each by an adjacency relation.

Other examples of mechanical assemblies of parts and functional structures thereof are now discussed.

In the context of the present disclosure, a mechanical assembly of rigid parts may be any type of vehicle, such as a car (as previously discussed), a motorcycle, a truck or a plane. Alternatively, a mechanical assembly of rigid parts may also be any type of furniture, such as a chair (as previously discussed). Alternatively, a mechanical assembly of rigid parts may be any type of robot, such as an articulated robot (as previously discussed). In examples, all of these object classes/categories present a high level of symmetry relation between parts and/or sub-assemblies. For example, these object classes/categories may be such that at least 50% of the parts and/or sub-assemblies are directly or indirectly involved in a symmetry relation. Alternatively or additionally, these object classes categories may be such that parts are organized in several (e.g., more than three) coherent substructures. Adjacency relations allow to represent/create such substructures. These substructures may correspond to meaningful substructures in terms of functionalities or independent sub-assemblies. Having a representation of such substructures helps the designer to focus on specific substructures.

The providing S10 of the dataset of functional structures is now discussed.

The providing S10 of the dataset may comprise retrieving (e.g., from a distant computer) at least a part of the functional structures (e.g., all of them) from a memory. The providing S10 of the functional structures may additionally or alternatively comprise creating each functional structure of at least another part of the functional structures. Creating a functional structure may consist in creating (e.g., graphically) the functional structure from scratch, notably including specifying the nodes and an arrangement thereof to form the tree of the functional structure. Alternatively, creating a functional structure may comprise retrieving (e.g., from a memory or a library such as the Shapenet library for chair models) an initial functional structure which already exists and modifying it so as to obtain the functional structure. For example, the initial functional structure may comprise the tree, but the leaf nodes of the tree (or at least a part of them) may comprise no data representing forces exerted on the rigid parts represented by the leaf nodes. In such a case the modifying may consist in adding to said leaf nodes said data representing forces. The providing S10 of the dataset may be carried out by a user.

The dataset may consist in or substantially consist in functional structures representing mechanical assemblies of rigid parts which all belong to a same class of mechanical assemblies of rigid parts. In examples, mechanical assemblies of rigid parts form a class of mechanical assemblies of rigid parts if they all respect one or more criterion. Each respective one of these one or more criterion may be any one or any combination of the following conditions:

the mechanical assemblies of rigid parts are all manufactured in the same manufacturing process or in the same combination of manufacturing processes;
the mechanical assemblies of rigid parts are all from a same field of technology and/or industry;
the mechanical assemblies of rigid parts all perform the same or similar mechanical function(s);
the mechanical assemblies of rigid parts are all made of the same or at least substantially similar rigid parts;
the mechanical assemblies of rigid parts have all the same or at least a similar underlying hierarchy;
the mechanical assemblies of rigid parts have similar types of meaningful substructures;
the mechanical assemblies of rigid parts all have the same or substantially the same shape; and/or
the mechanical assemblies of rigid parts all obey to same mechanical constraints, functional constraints, manufacturing constraints, and/or structural constraints.

In examples, the dataset is made of or substantially made of functional structures each representing a car, i.e., a mechanical assembly of parts belonging to the class of cars.

In other examples, the dataset is made of or substantially made of functional structures each representing a plane, i.e., a mechanical assembly of parts belonging to the class of planes.

In other examples, the dataset is made of or substantially made of functional structures each representing a chair, i.e., a mechanical assembly of parts belonging to the class of chairs.

In other examples, the dataset is made of or substantially made of functional structures each representing an articulated robot, i.e., a mechanical assembly of parts belonging to the class of articulated robots.

The learning S20 of the generative autoencoder is now discussed. First, the general concepts of "machine-learning" and "learning a neural network", as well as other related concepts are discussed.

As known from the field of machine-learning, the processing of an input by a neural network includes applying operations to the input, the operations being defined by data including weight values. Learning of a neural network thus includes determining values of the weights based on a dataset configured for such learning, such a dataset being possibly referred to as a learning dataset or a training dataset. For that, the dataset includes data pieces each forming a respective training sample. The training samples represent the diversity of the situations where the neural network is to be used after being learnt. Any dataset referred herein may comprise a number of training samples higher than 1000, 10000, 100000, or 1000000. In the context of the present disclosure, by "learning a neural network on a dataset", it is meant that the dataset is a learning/training set of the neural network.

The generative autoencoder is a Deep Neural Network (hereinafter referred to as "DNN") which is a combination of a Variational Autoencoder (hereinafter referred to as "VAE") and of a Generative Adversarial Network (hereinafter referred to as GAN). The generative autoencoder is a VAE with the addition of a discriminative network, added during the learning S20. This discriminative network is trained (during the learning S20) to perform a binary classification by classifying the output of the VAE between two classes: "real" or "fake". As known per se, "fake" means it is actually generated by the VAE, "real" means it comes from the provided S10 dataset of functional structures. The generative autoencoder may be referred to as a VAE-GAN. The generative autoencoder may be trained/learnt S30 by using any machine-learning technique adapted for training such a neural network. The learning may notably comprise minimizing several losses, including a reconstruction loss, an adversarial loss, a cross-entropy loss, and a GAN loss, e.g., by means of one or more Gradient Descent Algorithms. The reconstruction loss may comprise a so-called KL-divergence term. The generative autoencoder may notably be learnt S20 so as to reconstruct faithfully an input tree of a functional structure, the reconstruction loss measuring a (e.g., L2) distance between the input tree and the output tree reconstructed by the autoencoder. The encoding and decoding functions of the autoencoder are thus bijective functions.

As known per se, Deep Neural Networks are neural networks learnt by Deep Learning techniques, which are a powerful set of techniques for learning in Neural Networks which is a biologically-inspired programming paradigm enabling a computer to learn from observational data. In image recognition, DNNs are able to learn rich midlevel media representations as opposed to hand-designed low-level features (Zernike moments, HOG, Bag-of-Words, SIFT, etc.) used in other image categorization methods (SVM, Boosting, Random Forest, etc.). More specifically, DNNs are focused on end-to-end learning based on raw data. In other words, they move away from feature engineering to a maximal extent possible, by accomplishing an end-to-end optimization starting with raw features and ending in labels.

As known per se, a discriminative deep neural network is a function which is learnt to estimate a discrete or continuous value y given an input x. It is learnt on a dataset of pairs (x, y).

As known per se, Deep Generative Models are a class of deep neural networks that learn to replicate the data distribution of the dataset on which it is trained. There are two classes of deep generative models: Variational Autoencoders and Generative Adversarial Network. Hybrid generative models can be built from these two: a Variational Autoencoder—Generative Adversarial Network, such as the generative autoencoder.

As known per se, a variational autoencoder is composed of two parts: an encoder and a decoder. The encoder takes the input x and outputs a distribution probability. This distribution is set to be Gaussian so the encoder outputs two vectors mu and sigma of same size. Then the decoder tries to reconstruct the x given a z sampled from the distribution output by the encoder.

As known per se, a GAN is learnt to generate "realistic" samples given a dataset of real samples during the training stage. For example, if a GAN is learnt on a dataset of flower images, once trained, the GAN is able to generate images of flower which looks very realistic. A GAN is composed of two networks: a generator and a discriminator. The generator takes as input a low-dimensional latent variable z which is sampled from a Gaussian distribution. The output of the generator f(z) is a sample of the same type as the data within the training dataset. For instance, if training data are 512× 512 images, f(z) is a 512×512 image; if training data are binary trees, f(z) is a binary tree. The trick to learn the generator consists in using a discriminator which is learnt to perform binary classification on its input between two classes: "real" or "fake". Its input must be classified as "real" if it comes from the training dataset and as "fake" if it comes from the generator. During the learning, while the discriminator is leaned to perform its binary classification task, the generator is learnt to "fool" the discriminator by producing samples which are classified as "real" by the discriminator. To learn both networks jointly, a special loss may be used, called an adversarial loss.

The generative autoencoder is thus generative. As explained above, a neural network is said to be "generative" if it learns the distribution of training data. Only generative models can generate new data. A non-generative autoencoder can only contract a latent vector of small size input data (image 3D shape) and then rebuild it but is unable to generate a new data (from a random latent vector for example). The generative autoencoder is thus able to generate on the fly new functional structures which generate "realistic" functional structures, that is similar to those of the provided S10 dataset.

Moreover, the generative autoencoder is a Recursive Neural Network, which makes it particularly adapted to be learnt at the learning S20 on the dataset of functional structures each including a tree.

As known per se, a Recursive Neural Network is a kind of deep neural network composed of recursive modules. These modules can of two types: encoding modules and decoding modules. An encoding module takes as inputs several (e.g., two) fixed size vectors and outputs one fixed size vector. The number of inputs of the encoding module is fixed. A decoding module takes as inputs one vector and outputs several (e.g., two) fixed size vector. The number of outputs of the decoding module is fixed and equals the number of inputs of a corresponding encoding module. The generative autoencoder is thus a VAE-GAN, as previously discussed, with recursive modules. The encoder network transforms a variable-size input tree structure into a fixed-size latent vector by repeatedly, in a bottom-up fashion, collapsing child nodes represented as codes into a merged code. By an inverse process, the decoder network is trained to recover the input tree structure from the final latent code output by the encoder network. The learning S20 of the generative neural network may use any machine-learning technique able to learn a VAE-GAN with recursive modules.

The recursive modules of the generative autoencoder are now further discussed.

In examples, the generative autoencoder comprises an encoder and a decoder. In these examples, the encoder includes a leaf encoding module, a mechanical link encoding module, and a duplication encoding module. The leaf encoding module, the mechanical link encoding module, and the duplication encoding module are recursive modules as previously discussed. In these examples, the decoder includes a node classifier, a leaf decoding module, a mechanical link decoding module, and a duplication decoding module. The leaf decoding module, the mechanical link decoding module, and the duplication decoding module are recursive modules.

These examples are now further discussed.

In these currently-discussed examples, the encoder is configured, with respect to a given functional structure, for encoding the tree (i.e., of the given functional structure) into a single latent vector according to a recursive bottom-up process. In other words, the encoder takes as input the tree of the given functional structure and outputs the single latent vector. The encoder does so by recursively aggregating (or collapsing), by using its encoding modules, the nodes of the tree into successive latent vectors until reaching the root node. At the end of this recursive bottom-up encoding process, the tree is encoded into the single latent vector.

During the bottom-up encoding process, the leaf encoding module outputs, for each leaf node, a respective latent vector. The leaf encoding module does so based on the data comprising the specification of the bounding box and the resulting force. In examples, this means that, for each leaf node, the leaf encoding module takes as input the data comprising the specification of the bounding box (i.e., around the rigid part of which shape and positioning is represented by the leaf node) and the resulting force (i.e., exerted on said rigid part), and outputs a respective latent vector. As previously discussed, this data may be or comprise a vector having first coordinates characterizing the bounding box around the respective rigid part, second coordinates characterizing the resulting force, and optionally third coordinate(s) characterizing a type of geometric primitive. In such a case, the leaf encoding module transforms this vector into the respective latent vector.

During the bottom-up encoding process, the mechanical link encoding module outputs, for each non-leaf node representing a mechanical link, a respective latent vector. The mechanical link encoding module does so based on the several latent vectors which encode the respective several children of the non-leaf node. In examples, this means that, for each non-leaf node representing a mechanical link, each respective child of the non-leaf node having been previously encoded each into a latent vector, the mechanical link encoding module takes as input all these latent vectors and outputs the respective latent vector. As previously discussed, the non-lead node may further comprise a vector of mechanical link parameters. In such a case, the mechanical link encoding module may take as input, in addition of said latent vectors, the vector of mechanical link parameters, and may output the respective latent vector, the vector of mechanical link parameters being for example null when there is no mechanical linkage. Alternatively, the encoder may comprise a first mechanical link encoding module and a second mechanical link encoding module. The first mechanical link encoding module takes as input, for each non-leaf node representing a mechanical link with no vector of mechanical link parameters, all the latent vectors representing child nodes of the non-leaf node, and outputs a respective latent vector. The second mechanical link encoding module takes as input, for each non-leaf node representing a mechanical link with a vector of mechanical link parameters, all the latent vectors representing child nodes of the non-leaf node as well as the vector of mechanical link parameters, and outputs a respective latent vector.

During the bottom-up encoding process, the duplication encoding module outputs, for each non-leaf node representing a duplication, a respective latent vector. The duplication encoding module does so based on the latent vector which encodes the respective single child of the non-leaf node. In examples, this means that, for each non-leaf node representing a duplication, the single child of the non-leaf node having been previously encoded into a latent vector, the duplication encoding module takes as input this latent vector and outputs the respective latent vector. The duplication encoding module may further take as input the previously discussed data specifying a positioning of the several instances of the sub-assembly represented by the single child node in relation to each other. Notably, as previously discussed, this data may be or comprise a vector of symmetry relation parameters, in examples where the duplication is a symmetry relation. In such a case, the duplication encoding module takes as input said latent vector and the vector of symmetry relation parameters, and outputs the respective latent vector.

In said currently-discussed examples, the decoder is configured, with respect to a given single latent vector, for decoding the given single latent vector into a tree of a functional structure according to a recursive top-down process. In other words, the decoder takes as input the given single latent vector and outputs the tree. The decoder does so by recursively decoding, by using its decoding modules, successive latent vectors (i.e., latent vectors successively produced during and by the decoding process) into child latent vectors until child latent vectors are eventually decoded into leaf nodes.

During the top-down decoding process, the node classifier classifies each latent vector produced during the decoding, as corresponding to a leaf node, to a non-leaf node representing a mechanical link, or to a non-leaf node representing a duplication. In other words, for each successive latent vectors produced in the decoding (i.e., the given single latent vector and latent vectors outputted by the decoding modules), the node classifier takes as input the latent vector and classifies it as corresponding to a leaf node, to a non-leaf node representing a mechanical link, or to a non-leaf node representing a duplication. In other words, the node classifier guides the recursive decoding by classifying each successive latent vector as a corresponding to a type of node such that the right decoding module is applied to the latent vector. The node classifier may in fact, upon classification of a latent vector, select the decoding module to apply to this latent vector. In examples, decoding a latent vector comprises classifying the latent vector by calling the node classifier, selecting the right decoding module to decode the latent vector as a result of the classifying, and applying the selected decoding module to the latent vector.

During the top-down decoding process (e.g., and upon being selected by the node classifier), the leaf decoding module outputs, for each latent vector classified as corresponding to a leaf node during the decoding, data comprising a specification of a respective bounding box and a respective resulting force. The leaf decoding module does so based on the latent vector. In examples, this means that, as a result of the classification of the latent vector as corresponding to a leaf node, the leaf decoding module takes the latent vector as input and outputs the data comprising a specification of a respective bounding box (i.e., around a rigid part) and a respective resulting force (i.e., exerted on the rigid part). The data may be or comprise a vector having first coordinates characterizing the bounding box around the respective rigid part, second coordinates characterizing the resulting force, and optionally third coordinate(s) characterizing a type of geometric primitive. This amounts to say that the leaf decoding module outputs leaf nodes.

During the top-down decoding process (e.g., and upon being selected by the node classifier), the mechanical link decoding module outputs, for each latent vector classified as corresponding to a non-leaf node representing a mechanical link during the decoding, several child latent vectors. The mechanical link decoding module does so based on the latent vector. In examples, this means that, as a result of the classification of the latent vector as corresponding to a non-leaf node representing a mechanical link, the mechanical link decoding module takes the latent vector as input and outputs the several child latent vectors. In other words, the mechanical link decoding module outputs the several latent vectors encoding respectively the several child nodes of the non-leaf node to which the latent vector corresponds. The mechanical link decoding module may in examples further output a vector of mechanical link parameters, the vector of mechanical link parameter being for example null when there is no mechanical linkage. Alternatively, the decoder may comprise a first mechanical link decoding module and a second mechanical link decoding module. The first mechanical link decoding module takes as input, for each latent vector classified as corresponding to a non-leaf node representing a mechanical link with no vector of mechanical link parameters, the latent vector, and outputs the several latent vectors encoding respectively the several child nodes of the non-leaf node to which the latent vector corresponds. The second mechanical link decoding module takes as input, for each latent vector classified as corresponding to a non-leaf node representing a mechanical link with a vector of mechanical link parameters, the latent vector, and outputs the several latent vectors encoding respectively the several child nodes of the non-leaf node to which the latent vector corresponds, as well as the vector of mechanical link parameters.

During the top-down decoding process (e.g., and upon being selected by the node classifier), the duplication decoding module outputs, for each latent vector classified as corresponding to a non-leaf node representing a duplication during the decoding, a single child latent vector. The duplication decoding module does so based on the latent vector. In examples, this means that, as a result of the classification of the latent vector as corresponding to a non-leaf node representing a duplication, the duplication decoding module takes the latent vector as input and outputs the single child latent vector. In other words, the mechanical link decoding module outputs the single latent vector encoding the single child node of the non-leaf node to which the latent vector corresponds. The mechanical link decoding module may in examples further output data specifying a positioning of several instances of the sub-assembly represented by the single child node in relation to each other, such as a vector of symmetry parameters.

In examples of the learning method (or of the offline stage of the modeling process), one or more nodes of the tree (e.g., all of them) of at least a part of the functional structures of the dataset (e.g., all of them) are each tagged with one label among a predetermined list of labels. In these examples, the learning method (or of the offline stage of the modeling process) further comprises learning (teaching) S30 a latent space classifier. The latent space classifier is a neural network configured to take as input a latent vector and to tag the latent vector with one label of the predetermined list of labels.

Such examples are now discussed.

The dataset may be provided S10 with each tree of said at least a part already tagged with label(s) of the predetermined list. When it is said that a tree is tagged with label(s) of the predetermined list, it is meant that one or more first nodes of the tree are tagged with a first label of the predetermined list. One or more second nodes of the tree may be tagged with a second label of the predetermined list. One or more third nodes may be tagged with a third label of the predetermined list, e.g., and so on so that each node of the tree is tagged with a respective label belonging to the predetermined list. Additionally or alternatively, the providing S10 may comprise tagging, e.g., upon user action, one or more trees (e.g., all trees) of said at least a part with label(s) of the predetermined list.

The predetermined list of labels may be provided (e.g., before or during the providing S10) by a user. The predetermined list of labels may be relative (e.g., specific) to a class of mechanical assemblies of rigid parts of the provided dataset of functional structures. By this it is meant that all or substantially all functional structures of the provided dataset represent mechanical assemblies of rigid parts which all belong to a same class of mechanical assemblies of rigid parts, as previously discussed, and that the predetermined list of labels pertains to this class. The predetermined list of labels may notably consist of a special label and other labels. The special label indicates the absence of labels, while each respective one of the other labels represents (e.g., indicates) a meaningful substructure typical of the class. One of the other labels may be a label indicating the class, with which only the root node is tagged. In other words, a tree representing a mechanical assembly of rigid parts belonging to the class and which is tagged with labels of such a list may be tagged as follows:

any node representing a sub-assembly which is also a meaningful sub-structure of the mechanical assembly of rigid parts may be tagged with a label indicating the meaningful substructure. It is to be understood that all children nodes of the node, if any, are part of the meaningful sub-structure as well and thus are not tagged with the label indicating the meaningful substructure. Only the parent node of the substructure is tagged. Child nodes, if any, may however be tagged with another label of the list, e.g., if it corresponds to another meaningful substructure within the substructure.

other nodes are tagged with the special label, as none of them is parent node of a meaningful substructure. For example, when the class of mechanical assemblies of rigid parts of the provided dataset of functional structures is the class of cars, the predetermined list of labels may made of the following labels: special label, label "Car" (indicating the class, for tagging the root node), label "Body Substructure", label "Interior Substructure" and label "Chassis".

For example, when the class of mechanical assemblies of rigid parts of the provided dataset of functional structures is the class of chairs, the predetermined list of labels may made of the following labels: special label, label "Chairs" (indicating the class, for tagging the root node), label "Arm", label "Leg", label "Seat", and label "Back".

The latent space classifier may be learnt jointly with the generative autoencoder (i.e., the learning S30 of the latent space classifier and the learning S20 of the generative autoencoder are performed jointly) or after (i.e., the learning S30 of the latent space classifier is performed after the learning S20 of the generative autoencoder), by using any machine learning technique able to learn a neural network configured to take as input a latent vector and to tag the latent vector with one label of the predetermined list of labels.

As previously explained, both the recursive bottom-up encoding process and the recursive top-down decoding processes recursively produce successive latent vectors. Each such successive latent vector corresponds to or encodes a node of a tree (i.e., of a functional structure) which may be any one of a leaf node, the root node, or an internal node (i.e., a non-leaf node which is not the root node). A successive latent vector may in other words belong to an intermediate latent space, which is a latent space containing latent vectors which correspond to leaf nodes, to root nodes, or to any non-leaf nodes in-between. The latent space classifier takes as input such a latent vector and tags the corresponding node with a label of the list. In other words, the latent space classifier is able to recognize and tag intermediate latent vectors, i.e., belonging to intermediate latent spaces, each with a label of the predetermined list. It is to be understood that intermediate latent vectors belonging to a same intermediate latent space are all tagged with the same label. Conversely, intermediate latent vectors tagged with a same label all belong to a same intermediate latent space.

In examples, an intermediate latent vector corresponding to a node representing a meaningful substructure is tagged with the label indicating the meaningful substructure. As previously discussed, child nodes of this node, if any, correspond to (e.g., are encoded by) child latent vectors of the intermediate latent vector. The latent space classifier takes as input each one of these child latent vectors (e.g., at a later stage/step of the decoding process) and tag it with a label which is not the label indicating the meaningful substructure, as only the parent node representing the substructure is tagged with this label. Nevertheless, such child latent vectors may be tagged with a label corresponding to another meaningful substructure, e.g., which is a substructure of the substructure representing by the parent node. If not, the child is tagged with the special label.

Tagging latent vectors corresponding to meaningful substructures allows to recognize these substructures during a recursive decoding based only on the intermediate latent vectors encoding them, by means of applying the latent space classifier to such latent vectors. This allows performance of operations on meaningful substructures, such as interpolation operations, as further discussed hereinafter. Interestingly, such operations may be performed on whole mechanical assemblies of rigid parts as well as on any meaningful sub-assemblies thereof.

Figure 5:
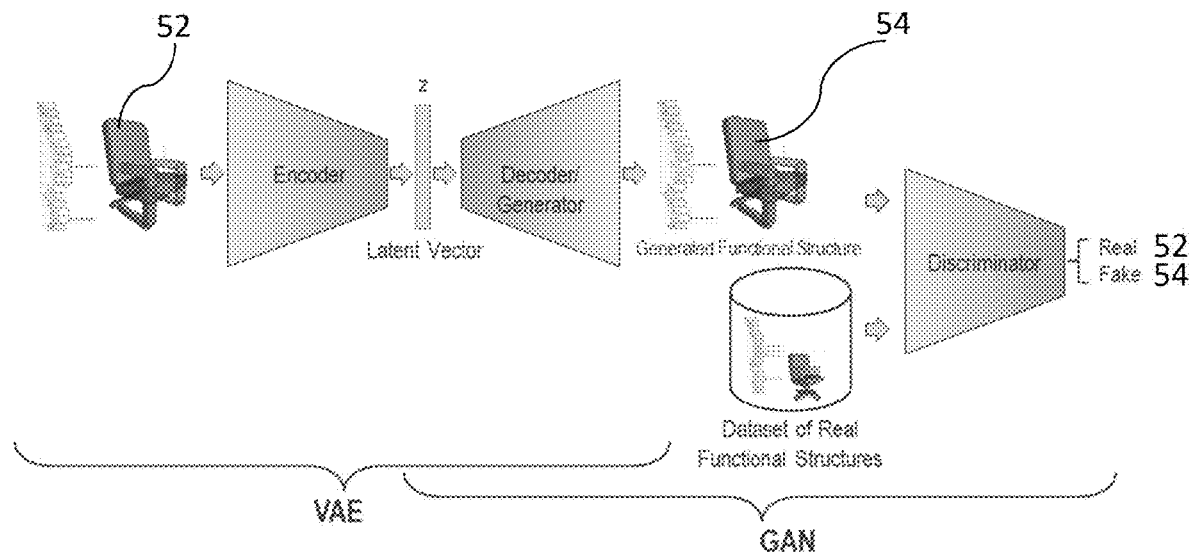
Figure 6:
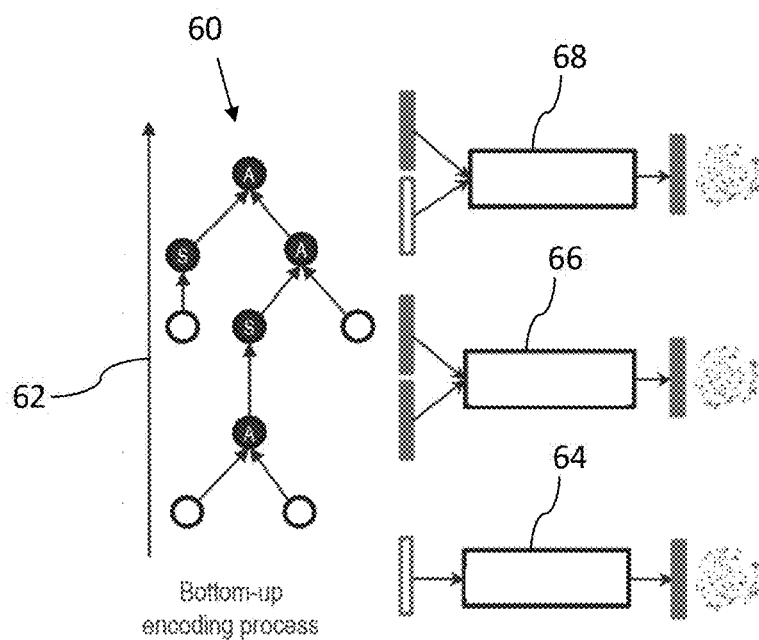
Figure 7:
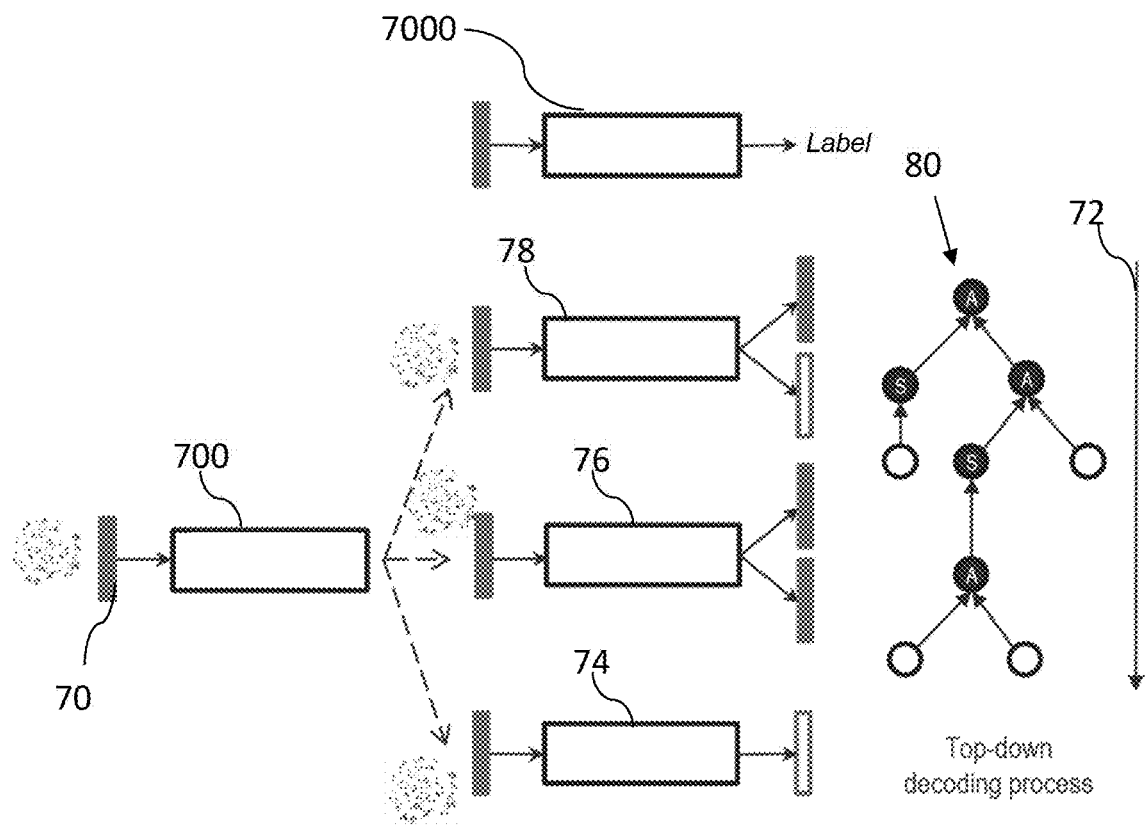

An implementation of the functional structures and of the generative autoencoder is now discussed, with reference to FIGS. 5 to 7.

In this implementation, the dataset is made of functional structures each including (e.g., consisting in) a binary tree which comprises, as previously discussed, leaf nodes, non-leaf nodes each with two children and each representing an adjacency relation between two sub-assemblies each represented by a respective one of the two children, and non-leaf nodes each with a single child representing a symmetry relation between instances of the sub-assembly represented by the single child. For the sake of simplicity, in the present discussion of the implementation, the non-leaf nodes with the two children will be referred to as "adjacency nodes" and the non-leaf nodes with a single child will be referred to as "symmetry nodes". In this implementation, each node of each or substantially each tree of the dataset is tagged with one label of the predetermined list, as previously discussed, and the latent space classifier is learnt S30 on the dataset.

The nodes of the tree are now further discussed. For the sake of clarity, in this discussion, the notation n-D signifies "n-dimensions" or "n-dimensional".

Each leaf node of the tree correspond to a (e.g., atomic) rigid part (i.e., of the mechanical assembly represented by the tree) and represents information about geometry, external physical forces and semantics of the rigid part in a fixed-sized vector. In other words, and as previously discussed, the leaf node comprises a vector having first coordinates characterizing a bounding box around the rigid part and second coordinates characterizing the resulting force exerted on the rigid part. Specifically, the leaf node is described (e.g., encoded) by a 18-dimension vector of the type $v_{leaf}=(b_1, \ldots, b_{12}, f_1, \ldots, f_6) \in \mathbb{R}^{18}$. The first 12 coordinates/parameters $(b_1, \ldots, b_{12})$ characterize the bounding box coordinates. The 6 last coordinates/parameters $(f_1, \ldots, f_6)$ characterize the resulting external force. The 12 parameters for the bounding box coordinates concatenate the coordinates of the box center, three dimension parameters (height, width and length) and two axes for its orientation within an absolute coordinate system. The resulting external force is a vector corresponding to the sum of all external force vectors which apply on the bounding box. $(f_1,f_2,f_3)$ parameters correspond to the resulting force application point and $(f_4,f_5,f_6)$ parameters correspond to the resulting vector. The 18-dimension vector may comprise a third coordinate representing a type of geometry of the rigid part. Specifically, the 18-dimension vector may comprise one additional integer coordinate/parameter $b_0$ which indicates the type of geometric primitives of the rigid part, which may be a geometric primitive characterized by a maximum of 12 parameters, such as a cylinder, a toroid, a pyramid or a sphere.

Each adjacency node of the tree has two children which are either leaf nodes, or one leaf node and an internal node, or two internal nodes. The adjacency node may further comprise a fixed-size vector of adjacency parameters characterizing a mechanical linkage between the two sub-assemblies represented by the two children. This fixed size vector may be of the type $x_3=(u_1, \ldots, u_{12}, f_1, \ldots, f_6) \in \mathbb{R}^{18}$. Coordinates/parameters $(u_1, \ldots, u_6)$ characterize a change of 3D frame. Coordinates/parameters $(u_1, \ldots, u_3)$ are three angles $\in [0;2\pi]$ to characterize any transformation with the same frame origin. Coordinates/parameters $(u_4, \ldots, u_6)$ correspond to a translation 3D vector for a change of the frame origin. Coordinates/parameters $(u_7, \ldots, u_{12}) \in \{0;1\}^6$ characterize a kinematic torsor of the type $$\begin{bmatrix} u_7 & u_{10} \\ u_8 & u_{11} \\ u_9 & u_{12} \end{bmatrix}$$

where $u_7$, $u_8$, $u_9$ are the freedom degrees for the three canonical rotations and $u_{10}$, $u_{11}$, $u_{12}$ are the freedom degrees for the three canonical translations. Coordinates/parameters $(f_1,f_2,f_3)$ parameters to a resulting force application 3D point and coordinates/parameters $(f_4,f_5,f_6)$ parameters correspond to a resulting 3D vector. It is to be understood that if $u_7=u_8=u_9=u_{10}=u_{11}=u_{12}=0$, there is no kinematic linkage between the two sub-assemblies. The adjacency relation may be then referred to as a static adjacency relation as previously discussed. To the contrary, if one of the freedom degrees of the kinematic tensor is non-zero, the adjacency relation may be referred to as a kinematic adjacency relation, as previously discussed.

Each symmetry node has a single child as previously explained. In the currently discussed implementation, the symmetry node further comprises a vector of symmetry relation parameters, as previously explained. The vector of symmetry relation parameters may be of the type $(s_1, \ldots, s_8) \in \mathbb{R}^8$. It is a second input (resp. output) to the symmetry encoding (resp. decoding) module, as further discussed hereinafter. Coordinate/parameter $s_1$ corresponds to the type of symmetry relation (reflectional, rotational and translational). Coordinate/parameter $s_2$ corresponds to a number of repetitions for rotational and translational symmetry relations. Coordinates/parameters $(s_3, \ldots, s_8)$ correspond to either parameters of the plane of reflection (comprising specifications (e.g., coordinates) of a 3D normal vector and of a 3D point belonging to the plane) for reflectional symmetry, either parameters of the rotational axis (comprising specifications/coordinates of a 3D vector collinear to the axis and of one point belonging to the axis) for rotational symmetry, or parameters of the displacement vector for the translational symmetry.

The generative autoencoder is now discussed. FIG. 5 shows a schematic view of the VAE-GAN structure of the generative autoencoder. The generative autoencoder further comprises an encoder and a decoder each respectively comprising recursive encoding and decoding modules, which are now discussed with reference to FIG. 6 and FIG. 7. Each recursive encoding module and each decoding module may be a two-layer perceptron network, e.g., with a 100-D hidden layer and a 80-D output layer.

FIG. 6 shows a schematic view of the recursive encoding modules of the encoder and of the recursive bottom-up encoding process, which have been previously discussed. As shown in FIG. 6, the encoder takes as input a given tree 60 of a functional structure and encodes it into a single fixed-size latent vector. Adjacency nodes of the tree 60 are represented as circles comprising a "A", symmetry nodes of the tree are represented as circles comprising a "S", and leaf nodes are represented as circles comprising no letter. The encoder comprises three recursive encoding modules (represented as bounded boxes 64, 66 and 68 in FIG. 6): the leaf encoding module 64, the mechanical link encoding module 66 (also referred to as "adjacency encoding module" in this implementation), and the duplication encoding module 68 (also referred to as "symmetry encoding module" in this implementation). The recursive bottom-up encoding process recursively collapses/aggregates the nodes of the tree 60 by going, according to the direction illustrated by arrow 62, from the bottom level of nodes of the tree 60 and up to the root node of the tree 60, and, each time a node is encountered, encoding the node by applying the proper encoding module, as described hereinafter.

During the encoding process, the leaf encoding module 64 encodes an encountered leaf node by taking as input the vector comprised in the leaf node (i.e., the vector having first and coordinates respectively characterizing a bounding box and a resulting force) and outputting one fixed-size latent vector. Specifically, the leaf encoding module 64 has one 18-D input (or optionally 19-D, in case the vector has a third coordinate as previously discussed) corresponding to the vector of the leaf node and one n-D output. Its parameters are a weight matrix $W_{ae} \in R^{n \times 18}$ and a bias vector $b_{ae} \in R^n$, which are used to obtain the latent vector of a parent node y from a child leaf node x using the formula: $y=\tanh(W_{ae} \cdot x + b_{ae})$.

During the encoding process, the adjacency encoding module 66 encodes an encountered adjacency node by:
- if the adjacency node comprises no vector of adjacency relation parameters (which is the situation illustrated on FIG. 6), taking as input two latent vectors each encoding a respective one of the two children of the adjacency node and outputting one latent vector. The adjacency encoding module has two n-D inputs and one n-D output, n being an integer. Its parameters are a weight matrix $W_{ae} \in R^{n \times 2n}$ and a bias vector $b_{ae} \in R^n$, which are used to obtain the latent vector of parent (merged) node y from children $x_1$ and $x_2$ using the formula: $y=\tanh(W_{ae} \cdot [x_1 x_2] + b_{ae})$.
- alternatively, if the adjacency node further comprises a vector of adjacency relation parameters, taking as input the vector and two latent vectors each encoding a respective one of the two children of the adjacency node, and outputting one latent vector. In this case, the adjacency encoding module has two n-D inputs, one m-D input corresponding to a vector of adjacency relation parameters and one n-D output, n and m being integers. Its parameters are a weight matrix $W_{ae} \in R^{n \times (2n+m)}$ and a bias vector $b_{ae} \in R^n$, which are used to obtain the latent vector of parent (merged) node y from children $x_1$, $x_2$ and p using the formula: $y=\tanh(W_{ae} \cdot [x_1 x_2 p] + b_{ae})$.

During the encoding process, the symmetry encoding module 68 encodes an encountered symmetry node by taking as input the latent vector encoding the single child of the symmetry node and the vector of symmetry relation parameters and outputting one latent vector. Specifically, the symmetry encoding module has two inputs, one n-D input and one s-D input (s=8), and one n-D output. Its parameters are a weight matrix $W_{se} \in R^{n \times (n+s)}$ and a bias vector $b_{se} \in R^n$, which are used to obtain the latent vector of parent (merged) node y from child node $x_1$ and symmetry parameter vector $x_2$ using the formula: $y=\tanh(W_{se} \cdot [x_1 x_2] + b_{se})$.

FIG. 7 shows a schematic view of the recursive decoding modules of the decoder and of the recursive top-down decoding process, which have been previously discussed. As shown in FIG. 7, the decoder takes as input a given single latent vector 70 of a functional structure and decodes it into a tree 80 of a functional structure. Adjacency nodes of the tree are represented as circles comprising a "A", symmetry nodes of the tree are represented as circles comprising a "S", and leaf nodes are represented as circles comprising no letter. The encoder comprises three recursive decoding modules (represented as bounded boxes 74, 76 and 78 in FIG. 7): the leaf decoding module 74, the mechanical link decoding module 76 (also referred to as "adjacency decoding module" in this implementation), and the duplication decoding module 78 (also referred to as "symmetry decoding module" in this implementation). The recursive top-down decoding process recursively decodes latent vectors produced by previous decoding steps into child latent vectors each representing a node of the tree 80 by going, according to the direction illustrated by arrow 72, from the given single latent vector (representing the root node of the tree 80) and down to the last child latent vectors produced during the decoding (and representing the nodes of the bottom level of the tree 80). Each time a produced latent vector is encountered, decoding the latent vector by applying the proper decoding module, as described hereinafter.

The decoder further comprises the node classifier 700, which, each time a latent vector is produced during the decoding, starting from the given single latent vector 70, takes as input the latent vector, classifies it as corresponding to a leaf node, an adjacency node or a symmetry node, and selects the right decoding module which is then applied to the latent vector. In other words the decoder guides the decoding as previously discussed.

During the decoding process, the leaf decoding module 74 decodes a produced latent vector classified as corresponding to a leaf node by taking as input the latent vector and outputting a 18-D vector (or optionally a 19-D vector) having first and second coordinates respectively characterizing a bounding box and a resulting force (and optionally a third coordinate specifying a type of geometric primitive). Specifically, the leaf decoding module has one n-D input and one 18-D output (or optionally 19-D, in case the vector has a third coordinate as previously discussed) corresponding to the vector of the leaf node. Its parameters are a weight matrix $W_{ae} \in R^{18 \times n}$ and a bias vector $b_{ae} \in R^{18}$, which are used to obtain the latent vector of a child leaf node x from a parent node y using the formula: $x=\tanh(W_{ae} \cdot y + b_{ae})$.

During the decoding process, the adjacency decoding module 76 decodes a produced latent vector classified as corresponding to an adjacency node by:
- if the latent vector is classified as corresponding to an adjacency node comprising no vector of adjacency relation parameters (which is the situation illustrated on FIG. 7), taking as input the latent vector and outputting two child latent vectors. Specifically, the adjacency decoding module 76 does the exact mirror operation of the one of the adjacency encoding module. It has one n-D input and two n-D outputs. The adjacency decoding module 76 Its parameters are a weight matrix $W_{ad} \in R^{2n \times n}$ and a bias vector $b_{ad} \in R^{2n}$, which are used to obtain the two latent vectors of the two child nodes $x'_1$ and $x'_2$ from a parent node y' using the formula: $[x'_1, x'_2]=\tanh(W_{ad} \cdot [y'] + b_{ad})$.
- alternatively, if the latent vector is classified as corresponding to an adjacency node comprising a vector of adjacency relation parameters, taking as input the latent vector and outputting two child latent vectors and a vector of adjacency parameters. In this case, the adjacency decoding module has one n-D input, two n-D outputs and one m-D output corresponding to a vector of adjacency relation parameters, n and m being integers. Its parameters are a weight matrix $W_{a,d} \in R^{(2n+m) \times n}$ and a bias vector $b_{a,d} \in R^{(2n+m)}$, which are used to obtain the latent vectors of children $x'_1, x'_2$ and the vector of adjacency relation parameters p' from the latent vector of parent node y' using the formula: $[x'_1\ x'_2\ p']=\tanh(W_{a'd} \cdot [y'] + b_{a,d})$.

During the decoding process, the symmetry decoding module 78 decodes a produced latent vector classified as corresponding to a symmetry node by taking as input the latent vector and outputting a single child latent vector and a vector of symmetry relation parameters. Specifically, the symmetry decoding 78 module does the exact mirror operation of the one of the symmetry encoding module: $[x'_1, x'_2]=\tanh(W_{sd}.[y']+b_{sd})$. Specifically, the symmetry decoding module has one n-D input and two outputs, one n-D output and one s-D output (s=8). Its parameters are a weight matrix $W_{sd} \in R^{(n+s) \times n}$ and a bias vector $b_{sd} \in R^{n+s}$, which are used to obtain child node x' and symmetry parameter vector p' from the latent vector of parent node y' using the formula: $[x'\ p']=\tanh(W_{sd}.y'+b_{sd})$.

FIG. 7 further shows the latent space classifier 7000, which, during the decoding process, takes as input a produced latent vector and tags it with one label of the predetermined list as previously discussed. The latent space classifier 7000 and the node classifier 700 may be learnt jointly or separately as previously discussed, and in this implementation they are both learnt by minimizing a so-called "multinomial logic loss" (also referred to as "a cross-entropy loss), which is of the type:

$$\text{Loss} = -\sum_{i=1}^{C} y_{true}^{i} \log\left(y_{pred}^{i}\right)$$

In this formula, C is the number of classes. In the case of the learning S20 of the node classifier, the classes are: leaf node, adjacency node, and symmetry node. In the case of the learning S30 of the latent space classifier, the classes are the labels of the predefined list. In the formula, $y_{true}^{i}$ is a binary indicator if class label i is the ground truth label and $y_{pred}^{i}$ is the predicted probability outputted by the network for this class. The node classifier takes as input a n-D vector and outputs a probability for each following classes: "leaf node", "adjacency node", "symmetry node". The label classifier takes as input a n-D vector and outputs a probability for each label of the list.

The providing S100 of the one or more latent vectors is now discussed.

Each latent vector of at least a part of the one or more latent vectors (e.g., all of them) may be provided S100 by sampling a Gaussian distribution, the sampling resulting in the latent vector. Alternatively or additionally, each latent vector of at least another part of the one or more latent vectors (e.g., all of them) may be provided by encoding a respective tree of a functional structure (e.g., of the provided S10 dataset or of another dataset, such as a test dataset, the concept of test dataset being known per se in the field of machine-learning) by applying the encoder to the tree, which encodes the tree into the latent vector.

The generating S200 of the functional structure is now discussed.

The generating S200 comprises decoding each latent vector (i.e., of the provided S100 one or more latent vector) with the decoder. In other words, for each latent vector, the generating S200 comprises applying the decoder to the latent vector. Applying the decoder to the latent vector, as previously discussed, produces successive child latent vectors, e.g., eventually until the decoding outputs a tree of a functional structure. In examples, notably in examples where the one or more provided S100 latent vectors consist in a single latent vector, the generating S200 may consist in decoding each provided S100 latent vector, the decoding outputting, for each latent vector, a respective tree of a functional structure. In case there is a single provided S100 latent vector, there is a single generated S200 functional structure including the respective tree into which the single latent vector is decoded.

In examples, the latent space classifier having been learnt S30, the one or more latent vectors comprise a first latent vector and a second latent vector. In these examples, the decoding produces, for each of the first latent vector and the second latent vector, respective latent vectors including respective intermediate latent vectors. In these examples, the generating S200 of the functional structure comprises performing an interpolation operation between a first intermediate latent vector of the first latent vector and a second intermediate latent vector of the second latent vector. The performing of the interpolation operation is based on a same label tagging the first intermediate latent vector and the second intermediate latent vector.

In other words, the decoding of the first (resp. second) latent vector generates first (resp. second) intermediate latent vectors. The first (resp. second) latent vector encoding a first (resp. second) tree of a functional structure, each respective first (resp. second) intermediate latent vector encodes a respective node of the first (resp. second) tree representing a respective sub-assembly of the mechanical assembly of rigid parts represented by the first (resp. second) tree. As previously explained, a respective intermediate latent vector may represent any one of a leaf node, an internal node, or the root node. The respective sub-assembly thereof may thus be any one of the whole mechanical assembly of rigid parts or a strict sub-assembly of the mechanical assembly of rigid part, such as a sole rigid part.

During the decoding of the first (resp. second) latent vector, for each respective first (resp. second) intermediate latent vector, the latent space classifier takes as input the respective first (resp. second) intermediate latent vector and tags it with one label of the predetermined list. The first intermediate latent vector and the second intermediate latent vector between which the interpolation is performed are tagged with the same label by the latent space classifier. This means that the first intermediate latent vector encodes a node of the first tree representing a first meaningful substructure of the first mechanical assembly of rigid parts and the second intermediate latent vector encodes a node of the second tree representing a second meaningful substructure of the second mechanical assembly of rigid parts. This also means that the first intermediate latent vector and the second intermediate latent vector both belong to a same intermediate latent vector space. This further means that the first meaningful substructure and the second meaningful substructure are of the same type, i.e., they are corresponding substructure of two mechanical assemblies of rigid parts of a same class.

The interpolation operation is now discussed. Let v1 and v2 be the first intermediate latent vector and the second intermediate latent vector, respectively. The interpolation operation is the linear interpolation operation that takes as input v1 and v2 and outputs the vector v3=a.v1+(1−a).v2 with a∈[0,1]. Performing the interpolation operation comprises computing the vector v3, and replacing one vector among the first intermediate latent vector and the second intermediate latent vector, say v1, by the computed the vector v3. The interpolation operation may be referred to as a blending operation is the limit case where a=1 or 0. Performing a blending operation thus consist in replacing v1 by v2 (or v2 by v1).

Once the interpolation operation has been performed, the decoding continues. More precisely, let us assume that v1 has been replaced by v3 (or simply v2 in case of a blending with a=0) as a result of the interpolation operation. Then, the decoding of the first latent vector continues, and consists in decoding v1, which now equals v3 and other child latent vectors of the first latent vector that have not been decoded yet. The decoding of the first latent vector results then in a first tree of a functional structure representing a mechanical assembly of rigid parts comprising a meaningful sub-assembly represented by the vector v3. The decoding of the second latent vector may continue as well until it yields a second tree.

It is to be understood that several operations may be performed, with different values of a.

Figure 8:
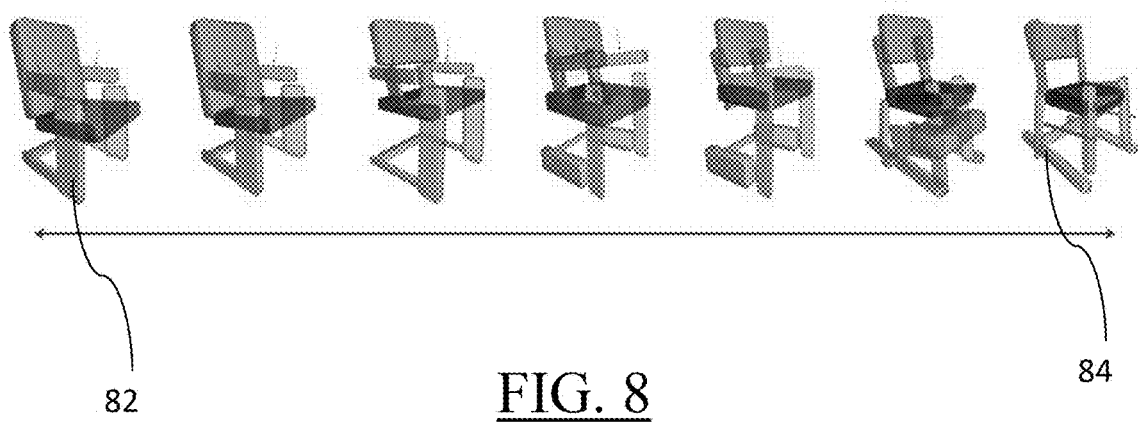
Figure 9:
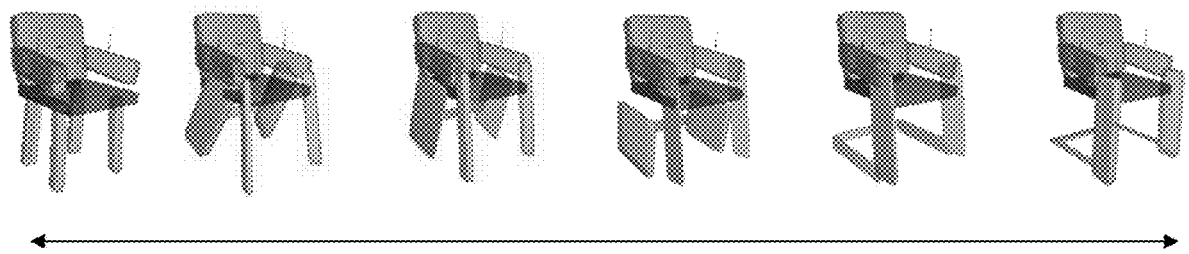
Figure 10:
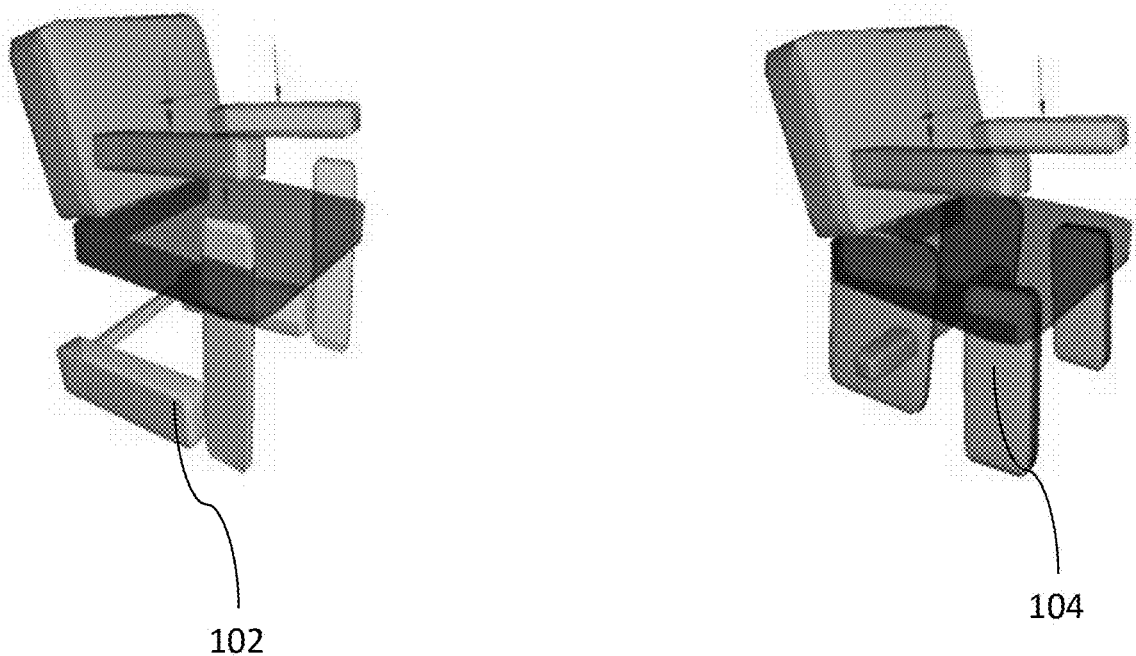

FIGS. 8, 9 and 10 illustrate the interpolation (or blending) operation in examples where the generative autoencoder has been learned S20 on a dataset of functional structures representing chairs. The trees of the have here been tagged with the labels "chair", "seat", "back", "arm" and "leg", as previously discussed.

As shown in FIG. 8, Chair 82 is a 3D view of the functional structure resulting from the decoding of the first latent vector without performing any interpolation operation. Chair 84 is a 3D view of the functional structure resulting from the decoding of the second latent vector without performing any interpolation operation. The other chairs represent, for different values of a, results of performing the interpolation operation between intermediate latent vectors representing the leg substructures of chair 82 and chair 84.

FIG. 9 shows another example of results of interpolations between leg substructures of chairs.

FIG. 10 shows a chair 104 resulting from a blending interpolation performed on chair 102, where the legs of chair 102 have been replaced by legs of another chair.

In any case, whether the generating S200 comprises an interpolation (or blending) or not, the generating S200 results in a generated functional structure representing a mechanical assembly of parts, on which a topology optimization can be performed as previously discussed.

The performing S300 of the topology optimization is now discussed. Prior to this discussion, concepts thereof are discussed.

Performing S300 a topology optimization on the mechanical assembly of rigid parts means performing any topology optimization method, process or algorithm on the mechanical assembly of rigid parts or on any data structure representing it and suited for topology optimization. Such a data structure may notably be or be inferred from the generated functional structure. As such, performing S300 a topology optimization comprises providing inputs of the topology optimization (i.e., providing input to the topology optimization method, process or algorithm).

As known per se from the field of topology optimization, the inputs of the topology optimization include a FEM. The FEM represents a space containing the mechanical assembly of rigid parts or any modeled object representing it. The FEM may be 2D or 3D. The FEM may be regular or irregular. A regular FEM allows easier computations during the topology optimization. The FEM may be of any type, for example with each finite element being a tetrahedron or a hexahedron. Providing the FEM may comprise defining a design space and a meshing of the design space. The performing S300 of the topology optimization may comprise displaying the FEM to the user, and, by the user, defining other inputs of the topology optimization, e.g., including by graphical user-interaction on the displayed FEM. By "graphical user-interaction" with respect to defining an element, it is hereby meant any user-interaction where the designer employs a haptic system (e.g., a mouse or a touch device such as a sensitive/touch screen or a sensitive/touch pad) to activate one or more locations of the display unit and where the element is to be positioned. Activating a location of a scene may comprise positioning thereon the cursor of a mouse or performing a touch thereon. Substantially real-time after the activation, a representation of the defined element may be displayed.

As known per se from the field of topology optimization, the inputs of the topology optimization further comprise data associated to the FEM and which depend on the mechanical assembly of rigid parts.

As known per se from the field of topology optimization, these associated data include parameters related to the material, in other words data representing the material in which the mechanical assembly of rigid parts is formed. These material parameters may in particular represent mechanical characteristics of the material. The material parameters may for example include the Young modulus of the material and/or the Poisson ratio of the material. In examples, the user may specify a material, for example by selection from a list, and/or the system may determine automatically the material parameters and/or propose selection thereof to the user, for example based on one or more formulas and/or on a database. The material can be any material, for example a solid and/or isotropic material, such as a metal (e.g., steel, silver, gold, titanium), a plastic (e.g., nylon, ABS, polycarbonates, resins), a ceramic or a composite for example.

As known per se from the field of topology optimization, the associated data further include a global quantity constraint. The global quantity constraint is relative to a global quantity of the material in the FEM. In other words, the global quantity constraint restricts values of the total quantity of the material in the whole FEM. The global quantity constraint may for example be provided as a boundary of the fraction of the (whole) FEM which can be filled with the material, for example an upper bound for said fraction. Alternatively, the global quantity constraint may, rather than a boundary, provide a value which has to be reached. The topology optimization may however optimize an objection function which tends to use as much material as available in the optimal result, rendering such an equality constraint equivalent to an upper bound constraint. In all cases, the fraction may be a volume fraction (also referred to as GVC in such a case, as in "Global Volume Constraint"). In other examples, the global quantity constraint may involve values representing weight of the material.

As known per se from the field of topology optimization, the associated data further include data representing conditions of use of the mechanical assembly of rigid parts and based on which the topology optimization is able to optimize the mechanical assembly of rigid parts model in view of such foreseen use.

As known per se from the field of topology optimization, the associated data notably include forces, such as the ones represented in the leaf nodes of the functional structures of the present disclosure. In other words, the associated data include vectors (e.g., with magnitudes in Newtons or in a multiple thereof) each applicable and linked to one or more finite elements of the FEM. These forces represent partially the loads to which the mechanical assembly of rigid parts will be subject when used. In other words, for each one or more finite elements of the FEM for which a respective force is present in the data, the data represent the fact that material of the mechanical assembly of rigid parts at locations corresponding to said one or more finite elements will be subject to corresponding loads. But since a mechanical assembly of rigid parts may theoretically be subject to an infinite number of loads, not all loads are represented by the forces present in the data. The forces only represent a restriction of the whole set of loads, for example most significant ones and/or most representative ones. The forces may be determined for each modeling problem and may be chosen to be the largest (i.e., highest magnitude) forces the object may be subject to during its lifetime, since these forces tend to cause the largest deformations and mechanical stresses. These forces may be grouped in sets called load-cases. An industrial problem may in examples have between one and a dozen load-cases. In examples, the user may select via graphical user-interaction finite elements of the FEM, and then specify a force applicable thereto.

As known per se from the field of topology optimization, the associated data also include boundary conditions. Each boundary condition applies and is linked to one or more finite elements of the mesh and represents a respective constraint on the boundary to which the mechanical assembly of rigid parts is subject in use. In other words, each boundary condition represents the fact that material of the mechanical assembly of rigid parts at locations corresponding to said one or more finite elements is subject to a constraint on its displacement, for example using Dirichlet boundary conditions. An element may have its displacement constrained (among others) along a plane, along a curve, along/around an axis, or to/around a point, and/or its displacement may be only constrained only in translation, only in rotation, or in both translation and rotation. In the case of a displacement constrained to a point both in translation and rotation, the element is fixed in 3D space and is said to be "clamped". An element may however have its displacement constrained in translation along a plane but move freely on said plane (e.g., if it belongs to an object mounted on a bearing), in translation along an axis but move freely on said axis (e.g., in a piston), or in rotation around an axis (e.g., joints of a robotic arm).

In examples, the boundary conditions represent all the constrained boundaries. In other words, for each finite element of the FEM which is intended to eventually contain material that is constrained (e.g., to remain fixed), a boundary (e.g., clamping) condition may be associated to integrate this fact in the topology optimization. In examples, the user may select via graphical user-interaction finite elements of the FEM, and then specify that boundary conditions are applicable thereto.

In examples, the one or more constrained boundaries of the mechanical assembly of rigid parts comprise or consist of one or more fixed boundaries (i.e., the material at said one or more boundaries cannot move), and the corresponding one or more boundary conditions are clamping conditions.

The topology optimization may as widely known comprise optimizing automatically an objective function based on the inputs. The objective function may represent any mechanical characteristic to be optimized. The topology optimization may in particular maximize stiffness. The objective function may for that be the compliance function. The compliance is for a structure the inverse of the stiffness of the structure. The compliance thus encapsulates the amount of deformation of the structure considering specified load scenarios and fixed boundary conditions. Therefore, when the optimization process minimizes the compliance, this corresponds to maximize the stiffness of the design for a given mass. The free variable of the objective function may be the distribution (i.e., layout) of quantity (e.g., volume fraction) of material over the FEM. The topology optimization may thus vary the material quantity (e.g., volume fraction) in each finite element of the mesh to optimize the objective function. The objection function may depend on the material parameters (i.e., fixed variables of the objective function may involve the material parameters) and the optimization may be performed under constraint, including the global quantity constraint. The optimization may be performed according to any algorithm, for example an iterative algorithm. In case the material quantity is a volume fraction of the material, the optimization process yields a distribution of finite-element-wise material volume fractions. In such a case, the topology optimization or the performing S300 of the topology optimization may comprise a further step of filtering (e.g., automatically), that is, determining for each finite element whether it is (fully) filled with material or not based on such volume fraction distribution. For example, this may be based on a comparison with a (e.g., predetermined) threshold (e.g., higher than 0.1 or 0.2 and/or lower than 0.9 or 0.8, e.g., of the order of 0.5), a finite element being considered as fully filled with material (resp. totally empty) if the volume fraction resulting from the optimization is higher (resp. lower) than the threshold. The performing S300 of the topology optimization may in examples further comprise computing (e.g., automatically) a 3D modeled object, such as a boundary representation (B-Rep) model, based on the result. For example, the performing S300 of the topology optimization may compute swept volumes based on and along series of finite elements resulting from the optimization and/or the filtering.

Figure 11:
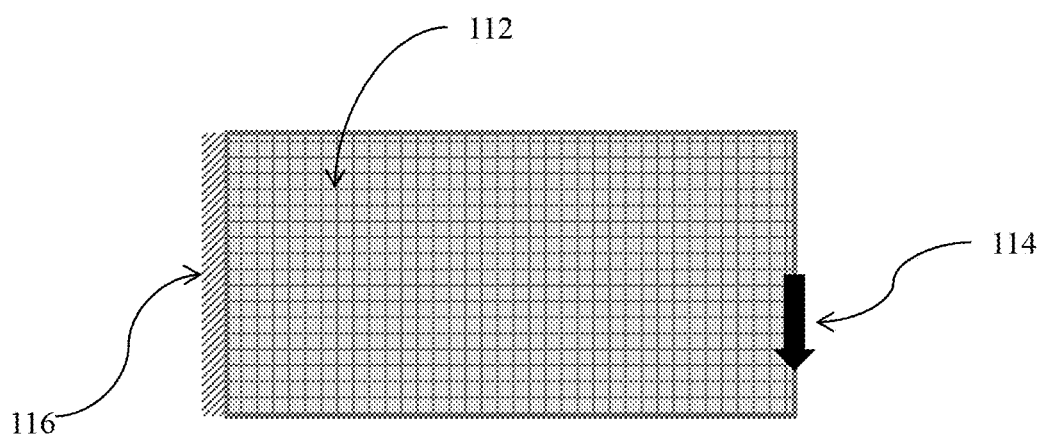

As shown in FIG. 11 which illustrates specification of a topology optimization scenario, the general topology optimization workflow requires as input a design space 112 (which is here subdivided in small square elements), a set of load-cases 114 (the forces that will be applied on the design) and boundary conditions 116 (locations where the design is constrained for deformations, e.g., "being clamped", here on the whole left side of the design space 112). Additional parameters can be defined, e.g., an outer shell that must be kept, the mechanical constitutive properties of the chosen materials, the target mass, the maximum allowed deformation, or any other constraint. The design workflow may exclude provision of an initial geometry except from the design space definition, since the goal of topology optimization is to generate the optimized design from an empty canvas (which is the design space).

Figure 12:
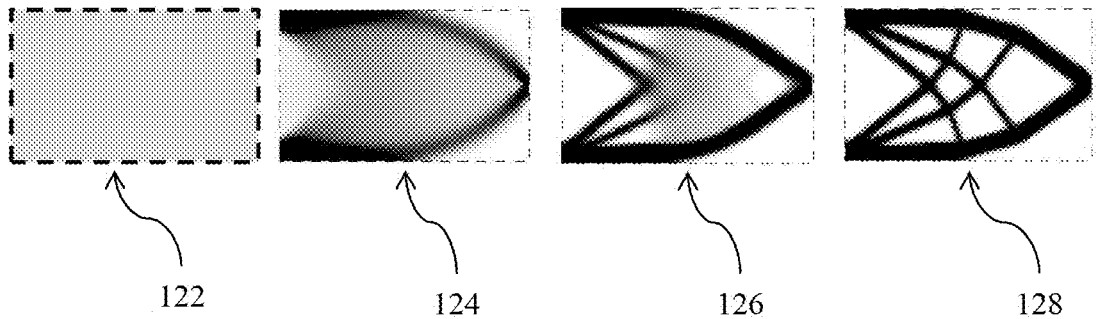

The output of the general topology optimization workflow is the geometry of the optimized design which complies as much as possible with the input specifications. FIG. 12 shows one such design being optimized, illustrating design evolving during the optimization process. In this example, the global volume fraction was set to 30%. FIG. 12 shows the initial design 122, the design after five optimization iterations 124, the design after ten optimization iterations 126, and the final converged design after twenty-five optimization iterations 128.

Figure 13:
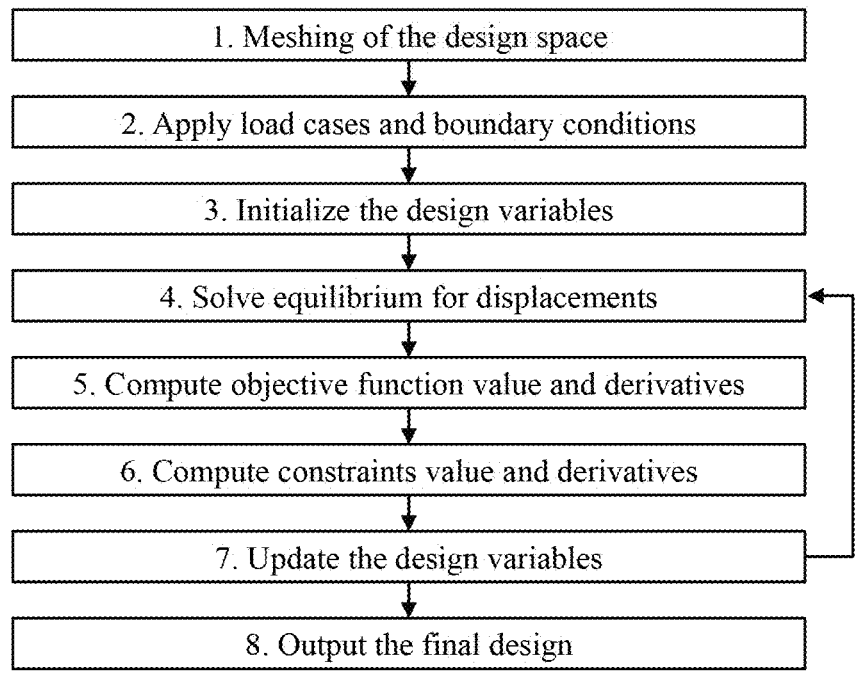

As shown in FIG. 13, the general topology optimization workflow may in examples follow eight steps described in the following:

1. Meshing of the Design Space

Create a discretization of the design space as shown in FIG. 11. This means subdividing the space into small simple connected elements e.g., tetrahedrons, hexahedrons. These small elements may later serve as both the FEM for the simulation and as design variables for the optimization.

2. Apply Load Cases and Boundary Conditions

Here, the general topology optimization workflow may take the forces and boundary conditions for a given input specification and apply them to the nodes of the FEM. FIG.

11 shows a mesh where the design space is subdivided into regular square elements. The nodes on the left side are clamped (fixed in 2D space) and a downward force is applied on the middle right hand side of the design space.

3. Initialize the Design Variables

Each element has a given relative density value defining whether it is empty or full of material, respectively defined by the values "0" and "1". Additionally, in order to make the optimization problem continuous, the general topology optimization workflow may allow the elements to take any value between 0 and 1. This may be referred to as "relaxation". Since the interpretation of elements with intermediate densities can be ambiguous, the general topology optimization workflow may introduce the penalization approach which forces intermediate elemental densities to be globally less efficient for the structural behavior than elements with the lower and upper bound of 0 or 1, respectively. This has the effect of driving the optimizer to produce final designs with few intermediate densities, while still maintaining the continuous formulation as shown in FIG. 12.

4. Solve for Equilibrium

At this point the general topology optimization workflow may have a complete defined finite element model being meshed and attached with forces and boundary conditions, and where each element has a relative density value. Thereby, the general topology optimization workflow may assemble the global stiffness matrix and solve for the nodal displacements of the structural equilibrium. In other words, the general topology optimization workflow may compute the deformation of the structure in its current state for the applied forces and boundary conditions.

5. Compute Objective Function Value and Derivatives

An objective function which may be used in any topology optimization is the compliance of the structure. It is the inverse of the stiffness and thus encapsulates the amount of deformation of the structure considering specified load scenarios and boundary conditions. Therefore, when the optimization process minimizes the compliance, this amounts to maximize the stiffness of the design for a given mass. Moreover, due to the large number of design variables in the process, the optimization may be performed with a gradient-based method. Therefore, the general topology optimization workflow may also compute the derivatives of the objective function with respect to each design variable. In other words, the general topology optimization workflow may compute how the relative density of each element should be changed to improve the compliance and fulfilling the constraints. For the compliance, this may be performed using the well-known and classic "Adjoint Sensitivity Analysis". Additionally, after the derivatives are calculated, these derivatives may be smoothed through a filtering to improve numerical stability. The general topology optimization workflow may reduce erroneous checkerboard patterns and introduce a length scale in the optimization, such that it is well-defined.

6. Compute Constraint Values and Derivatives

A constraint function in the general topology optimization workflow may be the global volume fraction of the structure. Such GVC defines the maximum material volume allowed to be used and therefore, the maximum mass of material constituting the designs. Consequently, the optimizer has to find the optimal distribution of this mass in the design space, maximizing the stiffness. FIG. 12 shows intermediate designs 124 and 126 in the optimization workflow where the global volume fraction is the same but the distribution of material changes during the optimization iteration in process. The derivatives for this constraint are equal to the elemental volume and if the elements are equal in size, then the derivatives are constant for each element and therefore trivial to compute.

7. Update the Design Variables Using Mathematical Programming

When the values of the objective function and the constraint are known as well as their derivatives then the general topology optimization workflow may use a gradient-based mathematical programming to modify the relative density of each element to improve the structural compliance without violating the specified GVC. Once the relative density value of each element has been modified by the mathematical programming, and the given modified design in the optimization process has not yet converged, then the general topology optimization workflow may loop back to step 4. A simple mathematical programming for this problem is the so-called Optimality Criteria (OC). Any other known mathematical programming may be used.

8. Output the Final Design

Once convergence is achieved, the general topology optimization workflow may present a finalized design in the design space where each element has an optimized relative density value. Through a simple thresholding process, the general topology optimization workflow may extract the geometry defined by the collection of elements whose relative density value is above a certain threshold (e.g., chosen to be 0.5). The general topology optimization workflow may now present the geometry of the optimized design which is the output of the general topology optimization workflow. FIG. 12 shows the final design 128 optimized on the specifications described in step 2 and shown in FIG. 11.

The performing S300 of the topology optimization on the mechanical assembly of rigid parts represented by the generated functional structure may implement all steps of this general topology optimization workflow.

Notably, the performing S300 of the topology optimization comprises in examples providing a topology optimization algorithm, such as any algorithm implementing the previously discussed general topology optimization workflow.

In these examples, the performing S300 of the topology optimization further comprises providing inputs to the topology optimization algorithm. This comprises retrieving at least a part of said inputs from the generated functional structure. For example, the generating S300 may generate forces which are each a force represented by a leaf node of the tree of the generated functional structure. These generated forces may form inputs of the topology optimizations, which are thus retrieved from the generated functional structure. As previously discussed, the topology optimization algorithm may further takes as input a FEM, data associated to the FEM and which depend on the mechanical assembly of rigid parts, global quantity constraints, conditions of use of the mechanical assembly of rigid parts, and/or boundary conditions (e.g., clamps).

In these examples, the performing S300 of the topology optimization comprises running the topology optimization algorithm on the mechanical assembly of rigid parts (e.g., or on any data structure representing it and suited for being inputted to the algorithm).

Figure 14:
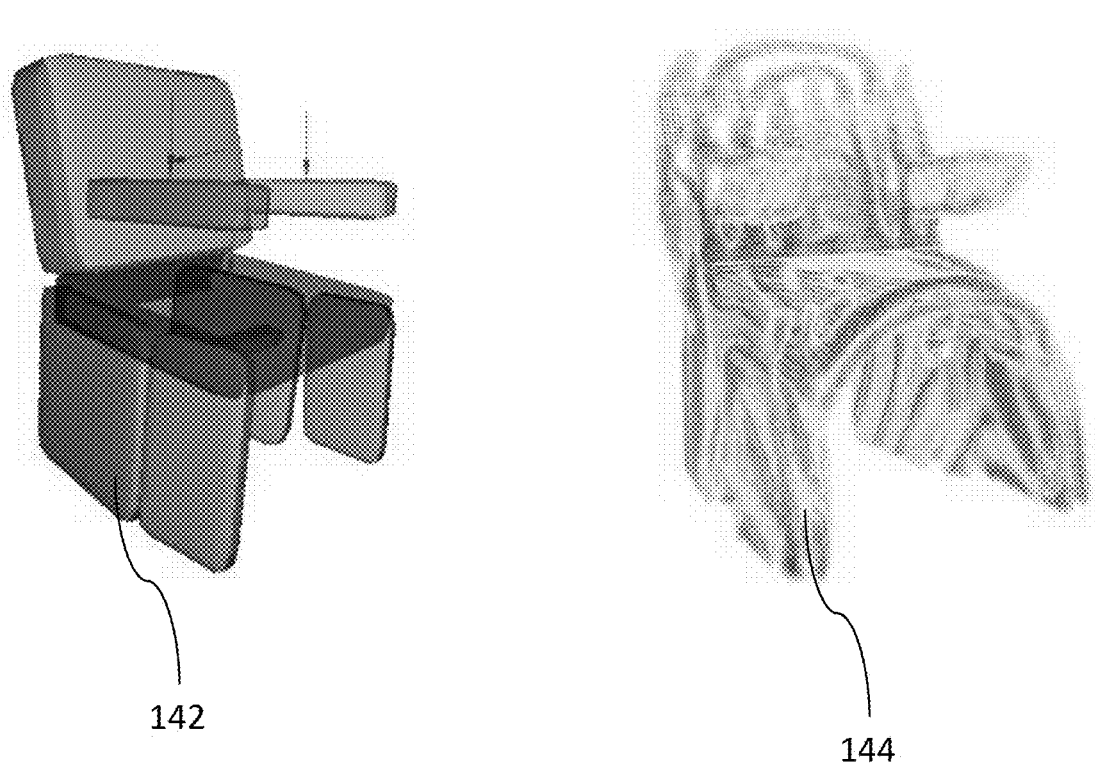

FIG. 14 shows an example of the result of performing S300 a topology optimization on a generated functional structure representing a chair. FIG. 14 shows a 3D view of the generated chair 142, and a 3D view of the result 144 of performing S300 the topology optimization on the generated chair 142.

Figure 15:
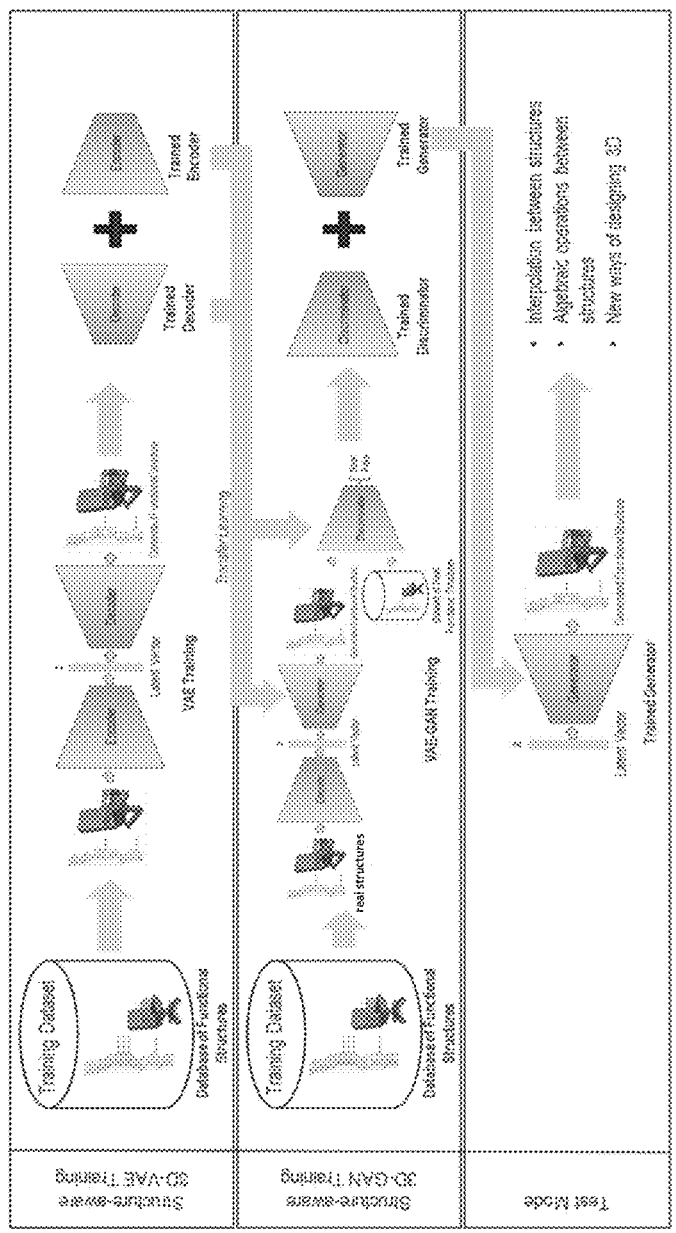

FIG. 15 is a pipeline illustrating an example of implementation of the modeling process.

The invention claimed is:

1. A computer-implemented method for teaching a generative autoencoder configured for generating functional structures, the method comprising:
   obtaining a dataset including functional structures, each functional structure of the dataset being a data structure representing a mechanical assembly of rigid parts, the data structure including a tree which includes:
      leaf nodes each comprising data, the data specifying a bounding box around a respective rigid part and specifying a force exerted on the respective rigid part, the force being a resulting force,
      non-leaf nodes each with several children and each representing an adjacency relation between sub-assemblies, each sub-assembly being represented by a respective one of the several children, the adjacency relation being one of a static adjacency relation and a kinematic adjacency relation, and
      non-leaf nodes with a single child and each representing a symmetry relation of the sub-assembly represented by the single child, the symmetry relation being one of a pairwise reflectional symmetry, a k-fold rotational symmetry and a k-fold translational symmetry; and
   teaching the generative autoencoder on the dataset to generate functional structures.

2. The method of claim 1, wherein the generative autoencoder includes:
   an encoder having a leaf encoding module, a mechanical link encoding module, and a duplication encoding module, and
   a decoder including a node classifier, a leaf decoding module, a mechanical link decoding module, and a duplication decoding module,
   wherein the encoder is configured, with respect to a given functional structure, to encode the tree into a single latent vector according to a recursive bottom-up process where:
      the leaf encoding module outputs, for each leaf node, a respective latent vector, based on the data comprising the specification of the bounding box and the resulting force,
      the mechanical link encoding module outputs, for each non-leaf node representing a mechanical link, a respective latent vector, based on the several latent vectors which encode the respective several children of the non-leaf node, and
      the duplication encoding module outputs, for each non-leaf node representing a duplication, a respective latent vector, based on the latent vector which encodes the respective single child of the non-leaf node, and
   wherein the decoder is configured, with respect to a given single latent vector, to decode the given single latent vector into a tree of a functional structure according to a recursive top-down process where:
      the node classifier classifies each latent vector produced during the decoding, as corresponding to a leaf node, to a non-leaf node representing a mechanical link, or to a non-leaf node representing a duplication,
      the leaf decoding module outputs, for each latent vector classified as corresponding to a leaf node during the decoding, data comprising a specification of a respective bounding box and a respective resulting force, based on the latent vector,
      the mechanical link decoding module outputs, for each latent vector classified as corresponding to a non-leaf node representing a mechanical link during the decoding, several child latent vectors, based on the latent vector, and
      the duplication decoding module outputs, for each latent vector classified as corresponding to a non-leaf node representing a duplication during the decoding, a single child latent vector, based on the latent vector.

3. The method of claim 2, wherein one or more nodes of the tree of at least a part of the functional structures of the dataset are each tagged with one label among a predetermined list of labels, and
   the method further comprises:
   teaching a latent space classifier, the latent space classifier being configured to take as input a latent vector and to tag the latent vector with one label of the predetermined list of labels.

4. The method of claim 1, wherein the bounding box and the resulting force are respectively represented by first coordinates and second coordinates of a same vector.

5. A computer-implemented method comprising:
   obtaining a generative autoencoder configured to generate a dataset including functional structures, each functional structure of the dataset being a data structure representing a mechanical assembly of rigid parts, the data structure including a tree which includes:
      leaf nodes each comprising data, the data specifying a bounding box around a respective rigid part and specifying a force exerted on the respective rigid part, the force being a resulting force,
      non-leaf nodes each with several children and each representing an adjacency relation between sub-assemblies, each sub-assembly being represented by a respective one of the several children, the adjacency relation being one of a static adjacency relation and a kinematic adjacency relation, and
      non-leaf nodes with a single child and each representing a symmetry relation of the sub-assembly represented by the single child, the symmetry relation being one of a pairwise reflectional symmetry, a k-fold rotational symmetry and a k-fold translational symmetry; and
   using the generative autoencoder to generate functional structures.

6. The method of claim 5, wherein the method further comprises:
   obtaining one or more latent vectors; and
   generating a functional structure, the generating including decoding each latent vector with the decoder.

7. The method of claim 6, further comprising:
   performing a topology optimization on the mechanical assembly of rigid parts represented by the generated functional structure.

8. The method of claim 7, wherein the generating generates forces which are each a force represented by a leaf node of the tree included in the generated functional structure, and
   wherein the generated forces form inputs of the topology optimization.

9. The method of claim 6, wherein the shape and positioning of the respective rigid part is represented by data comprising a specification of a bounding box around the respective rigid part, and the force exerted on the respective rigid part is a resulting force, and wherein the generative autoencoder further includes:
an encoder including a leaf encoding module, a mechanical link encoding module, and a duplication encoding module, and
a decoder including a node classifier, a leaf decoding module, a mechanical link decoding module, and a duplication decoding module,
wherein the encoder is configured, with respect to a given functional structure, to encode the tree into a single latent vector according to a recursive bottom-up process where:
the leaf encoding module outputs, for each leaf node, a respective latent vector, based on the data comprising the specification of the bounding box and the resulting force,
the mechanical link encoding module outputs, for each non-leaf node representing a mechanical link, a respective latent vector, based on the several latent vectors which encode the respective several children of the non-leaf node;
and
the duplication encoding module outputs, for each non-leaf node representing a duplication, a respective latent vector, based on the latent vector which encodes the respective single child of the non-leaf node,
wherein the decoder is configured, with respect to a given single latent vector, to decode the given single latent vector into a tree of a functional structure according to a recursive top-down process where:
the node classifier classifies each latent vector produced during the decoding, as corresponding to a leaf node, to a non-leaf node representing a mechanical link, or to a non-leaf node representing a duplication,
the leaf decoding module outputs, for each latent vector classified as corresponding to a leaf node during the decoding, data comprising a specification of a respective bounding box and a respective resulting force, based on the latent vector,
the mechanical link decoding module outputs, for each latent vector classified as corresponding to a non-leaf node representing a mechanical link during the decoding, several child latent vectors, based on the latent vector, and
the duplication decoding module outputs, for each latent vector classified as corresponding to a non-leaf node representing a duplication during the decoding, a single child latent vector, based on the latent vector,
wherein the one or more latent vectors include a first latent vector and a second latent vector,
wherein the decoding produces, for each of the first latent vector and the second latent vector, respective latent vectors including respective intermediate latent vectors, and
wherein the generating of the functional structure includes performing an interpolation operation between a first intermediate latent vector of the first latent vector and a second intermediate latent vector of the second latent vector, based on a same label tagging the first intermediate latent vector and the second intermediate latent vector.

10. A device comprising:
a non-transitory data storage medium having recorded thereon a computer program comprising instructions for teaching a generative autoencoder that generates functional structures, the computer program when executed by a processor causes the processor to be configured to:
obtain a dataset including functional structures, each functional structure of the dataset being a data structure representing a mechanical assembly of rigid parts, the data structure including a tree which includes:
leaf nodes each comprising data, the data specifying a bounding box around a respective rigid part and specifying a force exerted on the respective rigid part, the force being a resulting force,
non-leaf nodes each with several children and each representing an adjacency relation between sub-assemblies, each sub-assembly being represented by a respective one of the several children, the adjacency relation being one of a static adjacency relation and a kinematic adjacency relation, and
non-leaf nodes with a single child and each representing a symmetry relation of the sub-assembly represented by the single child, the symmetry relation being one of a pairwise reflectional symmetry, a k-fold rotational symmetry and a k-fold translational symmetry;
and
teach the generative autoencoder on the dataset to generate functional structures.

11. The device of claim 10, further comprising the processor coupled to the non-transitory data storage medium.

12. A device comprising
a non-transitory data storage medium having recorded thereon a computer program comprising instructions that when executed by a processor causes the processor to be configured to:
obtain a generative autoencoder configured to generate a dataset including functional structures, each functional structure of the dataset being a data structure representing a mechanical assembly of rigid parts, the data structure including a tree which includes:
leaf nodes each comprising data, the data specifying a bounding box around a respective rigid part and specifying a force exerted on the respective rigid part, the force being a resulting force,
non-leaf nodes each with several children and each representing an adjacency relation between sub-assemblies, each sub-assembly being represented by a respective one of the several children, the adjacency relation being one of a static adjacency relation and a kinematic adjacency relation, and
non-leaf nodes with a single child and each representing a symmetry relation of the sub-assembly represented by the single child, the symmetry relation being one of a pairwise reflectional symmetry, a k-fold rotational symmetry and a k-fold translational symmetry; and
using the generative autoencoder to generate functional structures.

13. The device of claim 12, wherein the processor is further configured to:
obtain one or more latent vectors; and
generate a functional structure by decoding each latent vector with the decoder.

14. The device of claim 12, further comprising the processor coupled to the non-transitory data storage medium.

15. A device comprising:
a non-transitory data storage medium having recorded thereon a generative autoencoder configured to generate a dataset including functional structures, each functional structure of the dataset being a data structure representing a mechanical assembly of rigid parts, the data structure including a tree which includes:
leaf nodes each comprising data, the data specifying a bounding box around a respective rigid part and specifying a force exerted on the respective rigid part, the force being a resulting force;
non-leaf nodes each with several children and each representing an adjacency relation between sub-assemblies, each sub-assembly being represented by a respective one of the several children, the adjacency relation being one of a static adjacency relation and a kinematic adjacency relation, and
non-leaf nodes with a single child and each representing a symmetry relation of the sub-assembly represented by the single child, the symmetry relation being one of a pairwise reflectional symmetry, a k-fold rotational symmetry and a k-fold translational symmetry.

* * * * *